United States Patent [19]
Hallberg

[11] Patent Number: 5,721,744
[45] Date of Patent: Feb. 24, 1998

[54] SYSTEM AND METHOD FOR CORRECTING BURST ERRORS IN DIGITAL INFORMATION

[75] Inventor: Bryan Severt Hallberg, Vancouver, Wash.

[73] Assignees: Sharp Microelectronics Technology, Inc., Camas, Wash.; Sharp Kabushiki Kaisha, Osaka, Japan

[21] Appl. No.: 604,117

[22] Filed: Feb. 20, 1996

[51] Int. Cl.$^6$ .................................................. H03M 13/00
[52] U.S. Cl. ........................................................ 371/39.1
[58] Field of Search ............................................ 371/39.1

[56] References Cited

U.S. PATENT DOCUMENTS

| | | | |
|---|---|---|---|
| Re. 31,666 | 9/1984 | Doi et al. | 371/45 |
| 3,859,630 | 1/1975 | Bennett | 340/146.1 |
| 3,882,457 | 5/1975 | En | 340/146.1 |
| 4,032,886 | 6/1977 | En et al. | 340/146.1 |
| 4,181,893 | 1/1980 | Ehmke | 325/492 |
| 4,295,218 | 10/1981 | Tanner | 371/40 |
| 4,353,065 | 10/1982 | Mori | 340/825.44 |
| 4,370,753 | 1/1983 | Ehmke | 455/36 |
| 4,413,340 | 11/1983 | Odaka et al. | 371/39 |
| 4,488,302 | 12/1984 | Ahamed | 371/40 |
| 4,592,054 | 5/1986 | Namekawa et al. | 371/39 |
| 4,618,955 | 10/1986 | Sharpe et al. | 371/37 |
| 4,652,875 | 3/1987 | Waki | 340/825.44 |
| 4,663,623 | 5/1987 | Lax et al. | 340/825.44 |
| 4,679,244 | 7/1987 | Kawasaki et al. | 455/54 |
| 4,745,408 | 5/1988 | Nagata et al. | 340/825.44 |
| 4,839,639 | 6/1989 | Sato et al. | 340/825.44 |
| 4,951,284 | 8/1990 | Abdel-Ghaffar et al. | 371/38.1 |
| 4,961,073 | 10/1990 | Drapac et al. | 340/825.44 |
| 4,996,526 | 2/1991 | DeLuca | 340/825.44 |
| 5,010,330 | 4/1991 | Snowden et al. | 340/825.21 |
| 5,051,999 | 9/1991 | Erhart et al. | 371/41 |
| 5,136,586 | 8/1992 | Greenblatt | 370/110.4 |
| 5,136,592 | 8/1992 | Weng | 371/39.1 |
| 5,179,560 | 1/1993 | Yamagishi et al. | 371/38.1 |
| 5,189,389 | 2/1993 | DeLuca et al. | 340/311.1 |
| 5,194,857 | 3/1993 | Gomez | 340/825.44 |
| 5,230,084 | 7/1993 | Nguyen | 455/38.3 |
| 5,233,344 | 8/1993 | Ohga | 340/825.44 |
| 5,247,519 | 9/1993 | Snowden et al. | 370/94.1 |
| 5,252,963 | 10/1993 | Snowden et al. | 340/825.44 |
| 5,296,849 | 3/1994 | Ide | 340/825.44 |
| 5,309,154 | 5/1994 | Mun et al. | 340/825.44 |
| 5,377,208 | 12/1994 | Schneider-Obermann | 371/38.1 |
| 5,381,133 | 1/1995 | Erhart et al. | 340/825.44 |
| 5,420,873 | 5/1995 | Yamagishi et al. | 371/38.1 |

*Primary Examiner*—Stephen M. Baker
*Attorney, Agent, or Firm*—Gerald W. Maliszewski; David C. Ripma

[57] ABSTRACT

A system and method of information correction using the independently derived parity of a received (n,k) cyclic digital codeword as a means for error checking so that error bursts of up to $[(n-k)-\lfloor \log_2 n \rfloor]$ bit positions are corrected, where n is the number of bits in the codeword and k is the number of information bits in the codeword. The method incorporates prior art techniques of burst error correction using a generating polynomial and the generation of n syndromes, in which the bit positions of potential error bits in the received codeword are identified and replaced to generate potential replacement codewords for the received codeword. The method of correcting burst errors comprises the step of classifying replacement codewords with respect to their calculated parity. The method also comprises the step of using prior art error trapping techniques to supply a replacement codeword, as the corrected received codeword, when a single replacement codeword is generated. The method further comprises the step of matching the independently derived parity of the received codeword to the calculated parity of replacement codewords to select the corrected codeword when multiple replacement codewords are generated. An apparatus to correct burst errors is also disclosed.

28 Claims, 4 Drawing Sheets

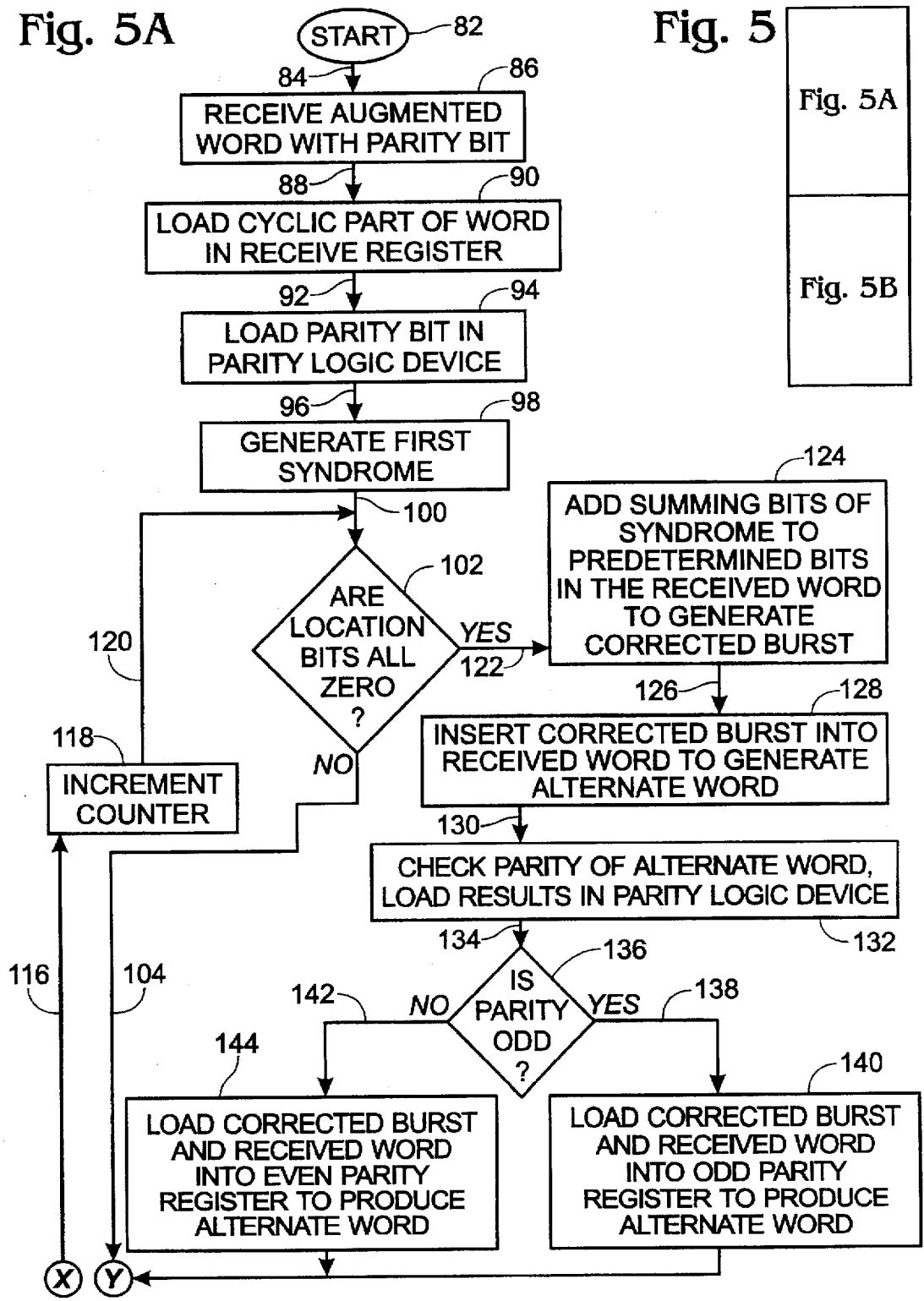

5,721,744

SYSTEM AND METHOD FOR CORRECTING BURST ERRORS IN DIGITAL INFORMATION

BACKGROUND AND SUMMARY OF THE INVENTION

The present invention relates generally to digital communications sent over airlinks, through cables, or stored on media such as magnetic tape, or the like, that is corrected to retrieve the original transmitted information. More specifically, the present invention relates to a system and method of using the overall parity of digitally formatted words, coded from generating polynomials, in combination with prior art error trapping techniques, to increase the number of consecutive bit positions that can be recovered after errors have occurred in the communication of that information.

Digital information, whether stored or communicated, has the potential for interruption and degradation. Degradation of the communicated digital information, resulting from the receipt of error bits, causes a decrease in the flow of information or an increase in the time needed to communicate information, or both. Degradation of the data can also result in entire messages being missed or misdirected. Therefore, most digital communication is formatted into words that include bits for both information and checking to verify that the proper information has been received after transmission. The selection of the proportion of information bits to error checking bits is a primary consideration in the design of any digital communications system.

Probably the simplest means of checking digital information is to include a parity bit at the end of a distal word. If the received word has the correct parity, i.e. is correctly "even" or "odd", the word is probably correct. In many well known digital codes the ones and zeros forming the digital word are summed in modulo 2 to determine the parity of the word. That is, the "1"s and "0"s numbers that occupy the bit positions of the digital word are added in base 2 with no carry-over to the next higher significant bit position. After addition, the one bit result is considered to be the parity of the digital word. The parity of the digital word is then amended, or inserted, into the word as an additional bit position. For example, a 7-bit digital word may have an eighth bit amended to it, in the least significant position perhaps, to represent the parity of the 7-bit word. After receiving such a digital word the parity bit is compared to the modulo 2 sum of the other 7-bits in the word. If the two parities match, there is increased confidence that the digital word has not been corrupted during transmission.

Many other systems exist to allow for more complete and more complex checking of information bits. In general, the greater number of check bits that are sent in a digital word, the more likely that the errors can be detected. However, the inclusion of many check bits in digital information decreases the flow of information bits. More advanced systems of checking allow for the correction of corrupted information bits. Once such system is the Bose-Chaudhuri-Hocquenghem, or BCH code. The BCH coding system allows for the creation a family of cyclic words derived from a generating polynomial, and is well known in the prior art.

One practical use of the BCH codes is in pager communications. The industrial standard for radio pagers, known by the acronym POCSAG (British Post Office Standardisation Advisory Group) calls for the use of BCH coding for address and information words. Details of the POCSAG format can be found in, "A Standard Code for Radiopaging" by the British Post Office. Primary issues in pager communications concern battery conservation and improving the likelihood of receiving accurate transmitted messages. Additional information about analyzing POCSAG signals in paging applications can be found in U.S. Pat. No. 5,537,100, entitled "System and Method for Analyzing Coded Transmissions Sent to Mobile Message Receivers", invented by Bryan S. Hallberg (presently application Ser. No. 08/223,706, filed Apr. 6, 1994.)

Correct decoding of the incoming message is the primary concern for most pager users. A pager has limited value to a user if the likelihood of receiving transmitted messages is not high, or if the message is likely to be misdirected. To improve the probability of receiving the correct transmitted message, various error correction systems are applied to the received messages to recover error bits that have become corrupted.

Prior art correction schemes for BCH codes used in the pager industry allow for the correction of two random errors, or four burst errors, in a 31 bit cyclic word such as used in the POCSAG format. Of these two error correction schemes, the burst error is probably the more useful. Many POCSAG messages are missed due to so called "event" related incidents that degrade transmissions. One such event is multi-path which occurs due to the reception of a RF or microwave encoded signal at two slightly different times, causing the degradation of received information. Other such events are interference from other transmission sources and blockage due to buildings, automobiles, foliage, or the like. These events tend to degrade consecutive bit positions, as opposed to random bit positions, in the received digital word. That is, all the bits received during the occurrence of one of these events are degraded.

Prior art devices acknowledge that in the POCSAG format, wherein a 31-bit cyclic word is composed of 21-information bits and 10 check bits, burst errors of no more than 4-consecutive bit positions can be reliably corrected. Some methods have been presented to improve the ability of a receiver to correct messages while working around the limitation of 4-bit burst error correction. Namekawa, et al., U.S. Pat. No. 4,592,054, discloses a means for correcting digital words using a combination of prior art burst error and random error correction techniques. However, the patent does not disclose any method of correcting burst errors of more than 4-bits.

Other devices, acknowledging the limitations associated with prior art methods of burst error correction, advocate alternate means of encoding digital information such as interleaving, or time multiplexing, to minimize the effects of interference events. Ahamed, U.S. Pat. No. 4,488,302 discloses a method of interleaving contiguous blocks of information so that individual bits from a block are not transmitted contiguously, making the blocks of information less susceptible to interference events. This method, however, does not disclose any means of correcting more bits in a burst error.

It would be advantageous to be able to operate a pager receiver in environments that cause burst errors. It would be advantageous if the pager receiver could correct larger burst errors than can be reliably done in the prior art, so that the receiver is more likely to receive broadcast messages.

It would be advantageous if larger bursts of errors could be corrected without reducing the number of information bits or increasing the number of check bits in a POCSAG word. In this manner, more bits can be corrected without reducing the flow of information, or modifying the standard POCSAG format.

Likewise, it would be advantageous if larger bursts of errors could be corrected, using prior art burst error correction techniques, in cyclic words derived from a generating polynomial, regardless of whether they are used in a POCSAG format or not. It would be advantageous if prior art burst error correction techniques could be used in these non-POCSAG systems to correct larger bursts of errors without increasing the number of check bits, or decreasing the number of information bits.

Accordingly, in a method of processing received digital information which includes one or more received (n,k) cyclic words, wherein n is the number of bit positions in the word, and k is the number of information bit positions in the word, and further includes parity information for each received word, and wherein the method of processing uses error trapping, a generating polynomial, and syndromes to identify and replace errors in the received words to yield processed words, a method for processing bursts of up to $[(n-k)-\lceil \log_2 n \rceil]$ bit positions is provided. The method for processing burst errors comprising the steps of searching by error trapping for the bit positions of a burst error of up to $[(n-k)-\lceil \log_2 n \rceil]$ bit positions in the received word, and producing an alternate word therefrom, and measuring the parity of the alternate word. The method comprising the step of repeating the error trapping procedure for all n bit positions of the received word, producing up to n alternate words therefrom, and making up to n parity measurements of the alternative words. The method also comprising the step of selecting a processed word from among alternate words as follows: when only one type of parity is measured in the production of the alternate words, selecting any alternate word as the processed word, and when both types of parity are measured in the production of the alternate words, selecting any alternate word with parity matching the parity information for the received word, as the processed word.

The symbol $\lceil \ \rceil$, as used herein, means "the ceiling of." The ceiling of an input value is the smallest integer which is equal to, or greater than, that input value. For example, $\lceil \log_2 31 \rceil = \lceil 4.954 \rceil = 5$.

In a preferred form of the present invention, the method provides the step of storing alternate words having even parity in an even parity register, and storing alternate words having odd parity in an odd parity register. It is also a feature of the method to use elements of the error trapping process to provide a step for producing alternate words in the even and odd parity registers. The syndrome words, generated in the search by error trapping for the bit positions of burst errors in the received word, comprise summing bits and locating bits which are used to generate corrected bursts of numbers. The method of the present invention includes the steps of supplying the corrected burst of numbers and the received word as inputs to the even and odd registers and producing alternate words by inserting the corrected burst of numbers into the potential error bit positions of the received words.

In one alternative, a receive register is provided for accepting received words. In the method of searching by error trapping for the bit positions of burst errors in the received word, the method of the present invention provides the step of rotating the numbers in the bit positions of the received words in the receive register, and further includes the step of rotating the numbers and the bit positions of the even and odd parity registers simultaneously with the rotation of the numbers in the receive register.

An apparatus has also been provided for correcting burst errors in digital information in accordance with the above described method. Accordingly, in a method of processing received digital information which includes one or more received (n,k) cyclic words, wherein n is the number of bit positions in the word, and k is the number of information bit positions in the word, and further includes parity information for each received word, and wherein the method of processing uses error trapping, a generating polynomial, and syndromes to identify and replace errors in the received words to yield processed words, an apparatus for processing bursts of up to $[(n-k)-\lceil \log_2 n \rceil]$ bit positions is provided. The apparatus comprising at least one register to store alternate words produced by error trapping for errors in up to $[(n-k)-\lceil \log_2 n \rceil]$ bit positions in the received word. The apparatus comprising a parity generator to accept the numbers in the n bit positions of the alternate words to calculate the parity of the alternate words, and to produce a parity sum output to indicate the calculated parity. The apparatus also comprising a final latch to select the processed word in response to the parity of the alternate and received words as follows: when the alternate words have only an odd parity, an alternate word having odd parity is selected as the processed word, when the alternate words have only even parity, an alternate word having even parity is selected as the processed word, and when the alternate words have both even and odd parity, the alternate word with parity matching the parity information of the received word is selected as the processed word.

In a preferred form of the apparatus, the register further comprises an even parity register and an odd parity register which are operatively controlled by the parity generator so that alternate words with odd parity are stored in the odd parity register and alternate words with even parity are stored in the even parity register.

A receive register is preferably used to accept received words. In the production of alternate words through error trapping, the numbers in the bit positions of the received words are rotated in the receive register, and the numbers in the odd and even parity registers rotate simultaneously with the rotation of numbers in the receive register.

A summing circuit preferably accepts numbers from predetermined bit positions of the syndromes and numbers from predetermined bit positions of the received words. The summing circuit adds the syndrome numbers, in modulo 2, with the numbers from the received word to provide a corrected burst of numbers of $[(n-k)-\lceil \log_2 n \rceil]$ bit positions. Also, the parity registers preferably accept corrected bursts provided by the summing circuit and received words from the receive register, so that the numbers in the corrected burst are inserted into predetermined bit positions of the received words to produce alternate words, which are summed in said parity generator to determine the parity of the alternate words.

The invention allows for the correction of up to an additional bit in a burst error by using the parity information already supplied in order to select, as the corrected word, the contents of one of the parity registers.

DETAILED DESCRIPTION OF THE PREFERRED EMBODIMENT

Figure 1:
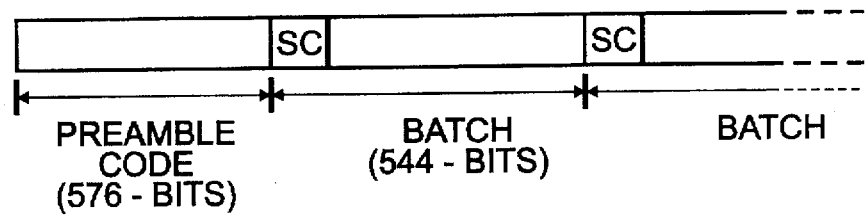
FIG. 1 is a schematic representation of the format of a coded transmission in accordance with the POCSAG standard (prior art).

FIG. 1 schematically illustrates a commonly used format for encoding transmissions in radio paging applications. The format was developed in the 1970s by British Telecom and is known by the acronym POCSAG, for British Post Office Code Standardization Advisory Group. In the POCSAG format, the message transmissions are grouped and transmitted as a sequence of address codes and message codes. Each time a POCSAG transmission is initiated it begins with a preamble code, having a duration of at least 576-bits alternating between ones and zeros. The code which follows the preamble code in a POCSAG transmission is a series of code groups called batches. Each batch contains a synchronization code followed by a plurality of code words. The duration of a batch is 544-bits, including 32-bit synchronization code word, followed by 16-address code words of 32-bits each.

Figure 2:
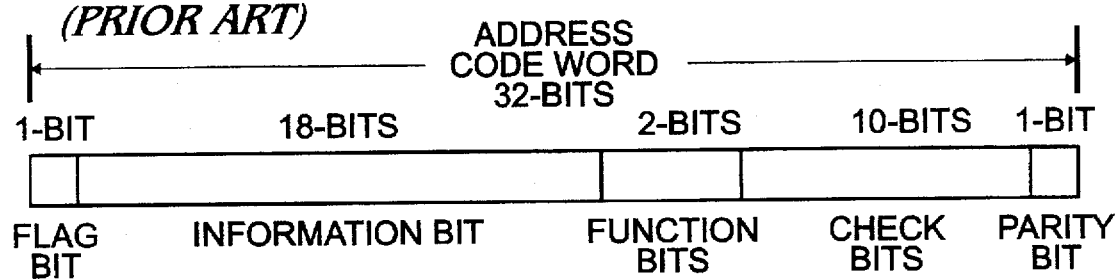
FIG. 2 is a schematic representation of a single 32-bit code address word used in the transmission format of FIG. 1 (prior art).

The format of individual address code words in a batch is illustrated schematically in FIG. 2. Each 32-bit code word comprises one 1-bit (used to distinguish between address and message code words), followed by 18-address bits (where a pager's address is encoded when a message is sent to the pager), followed by two function bits (generally used to specify the type of signaling device employed to alert the user), ten check sum bits (used in error correction of the address bits), and one parity bit (used in error correction of code words by the present invention). A message code word is similarly structured; 1-bit (to distinguish between address and message words), followed by 20-message bits, 10-check sum bits, and 1-parity bit. The foregoing description is prior art, well known to those familiar with POCSAG paging standards.

Therefore, each 32-bit POCSAG word is composed of 21-bits of information, 10-bits of error checking, and 1-parity bit. The 31-bits comprising the information and error checking bits are the BCH cyclic word. A more detailed description of BCH formats and cyclic words can be found in the text, "Error Correcting Coding Theory" by Man Young Rhee, McGraw Hill Communication Series, 1989. Every family of BCH cyclic words is derived from a generating polynomial which represents the spacing between words. The 31-bit cyclic word presented above is only one possibility among many combinations of information and error checking bits.

A POCSAG transmission is ultimately concerned with the transmission of 21-bits of information. The 10-error checking, or Cyclic Redundancy Check (CRC) bits, following the information bits are generated by amending the information bits with 10-bits of zero numbers. That is, the 21-information bits are shifted 10-bit positions higher in significance and zeros are inserted into the 10-least significant bit positions. This 31-bit position word is then divided by the generating polynomial to produce a 10-bit syndrome. This syndrome is amended to the 21-information bits to produce a 31-bit word for transmission, as shown in Table 1.

TABLE 1

Information Bits:  0 1111 0101 0001 0011 1000
Generating Polynomial:  111 0110 1001

```
                              010 0101 1111 0011 1110 01
111 0110 1001 ) 0 1111 0101 0001 0011 1000 0000 0000 00
                0 0000 0000 00
                1111 0101 000
                1110 1101 001
                 001 1000 0011
                 000 0000 0000
                  01 1000 0011 0
                  00 0000 0000 0
                   1 1000 0011 00
                   1 1101 1010 01
                    0101 1001 011
                    0000 0000 000
                     101 1001 0111
                     111 0110 1001
                      10 1111 1110 1
                      11 1011 0100 1
                       1 0100 1010 00
                       1 1101 1010 01
                        1001 0000 010
                        1110 1101 001
                         111 1101 0110
                         111 0110 1001
                          00 1011 1111 0
                          00 0000 0000 0
                           0 1011 1111 00
                           0 0000 0000 00
                            1011 1111 000
                            1110 1101 001
                             101 0010 0010
                             111 0110 1001
                              10 0100 1011 0
                              11 1011 0100 1
                               1 1111 1111 10
                               1 1101 1010 01
                                0010 0101 110
                                0000 0000 000
                                 010 0101 1100
                                 000 0000 0000
                                  10 0101 1100 0
                                  11 1011 0100 1
                                   1 1110 1000 10
                                   1 1101 1010 01
                                    0011 0010 11
```

Syndrome (check sum):  0011 0010 11

The numbers in the 31 bit positions of the transmitted words are summed, in modulo 2, to derive the parity of the cyclic word, which is either even or odd. The parity information is amended to the 31-bit word in the form of a parity bit in the least significant position. That is, the 31-bit cyclic word is shifted 1-bit position higher in significance and the parity bit is inserted into the least significant bit position, as shown in Table 2-1.

TABLE 2-1

| Transmitted codeword: | 011 1101 0100 0100 1110 0000 1100 1011 1 |
|---|---|
| Corrupted bits: | 1100 1 |
| Received codeword: | 011 1101 0100 1000 0110 0000 1100 1011 1 |

Upon reception of the transmitted word, the 31-bit cyclic word portion is again divided by the generating polynomial to recover the original 21-bits of information. The remainder after division is a 10-bit word called the first syndrome. If no error has occurred in the transmission of the 31-bit cyclic word, the syndrome will be all zeros to match the pattern of ten zeros inserted into the ten most insignificant bit positions of the cyclic word before transmission (see Table 1.) Alternately, patterns using other numbers besides ten zeros can be used to create the transmission word. The recovery of this same alternate pattern in the receiver after division of the transmitted word by the generating polynomial indicates the lack of errors in the transmission process. Table 2-1 shows a transmitted word, the cyclic word generated in Table 1 with it's amended parity bit. Table 2-1 also depicts the corruption of the transmitted word, as three numbers in a burst of 5-bit positions are corrupted. The corrupted word results in the received word. Table 2-2 illustrates the process of dividing the received word by the generating polynomial, 21-times, to produce the first syndrome.

TABLE 2-2

```
                    0 1001 0111 1110 0011 1010
111 0110 1001 )011 1101 0100 1000 0110 0000 1100 1011
               000 0000 0000
                11 1101 0100 1
                11 1011 0100 1
                 0 0110 0000 00
                 0 0000 0000 00
                   0110 0000 000
                   0000 0000 000
                    110 0000 0000
                    111 0110 1001
                     01 0110 1001 0
                     00 0000 0000 0
                      1 0110 1001 01
                      1 1101 1010 01
                       1011 0011 001
                       1110 1101 001
                        101 1110 0000
                        111 0110 1001
                         10 1000 1001 0
                         11 1011 0100 1
                          1 0011 1101 10
                          1 1101 1010 01
                            1110 0111 110
                            1110 1101 001
                             000 1010 1110
                             000 0000 0000
                              00 1010 1110 1
                              00 0000 0000 0
                               0 1010 1110 11
                               0 0000 0000 00
                                 1010 1110 110
```

TABLE 2-2-continued

```
                                 1110 1101 001
                                  100 0011 1110
                                  111 0110 1001
                                   11 0101 0111 1
                                   11 1011 0100 1
                                    0 1110 0011 00
                                    0 0000 0000 00
                                      1110 0011 001
                                      1110 1101 001
                                       000 1110 0001
                                       000 0000 0000
```

| First Syndrome: | 00 1110 0001 |
|---|---|

The processing of received, or uncorrected, words in the method of correction using error trapping, generating polynomials, and syndromes to identify and replace errors in uncorrected, or received words, to yield corrected, or processed, words is well known. To locate and correct all potential errors in the transmitted word, the first syndrome is further divided by the generating polynomial. After each division the remainder is shifted one bit position higher in significance and a zero inserted into the least significant digit. This new syndrome is once again divided by the generating polynomial. Table 2-3 shows the process of generating the remaining 30-syndromes.

TABLE 2-3

```
                       00 1000 1011 1100 0100 0001 0110 0100 0
111 0110 1001 )0011 1000 0100 0000 0000 0000 0000 0000 0000 0
                0000 0000 000
2.               011 1000 0100
                 000 0000 0000
3.                11 1000 0100 0
                  11 1011 0100 1
4.                 0 0011 0000 10
                   0 0000 0000 00
5.                   0011 0000 100
                     0000 0000 000
6.                    011 0000 1000
                      000 0000 0000
7.                     11 0000 1000 0
                       11 1011 0100 1
8.                      0 1011 1100 10
                        0 0000 0000 00
9.                        1011 1100 100
                          1110 1101 001
10.                        101 0001 1010
                           111 0110 1001
11.                         10 0111 0011 0
                            11 1011 0100 1
12.                          1 1100 0111 10
                             1 1101 1010 01
13.   Syndrome No.             0001 1101 110
                               0000 0000 000
14.                             001 1101 1100
                                000 0000 0000
15.                              01 1101 1100 0
                                 00 0000 0000 0
16.                               1 1101 1100 00
                                  1 1101 1010 01
17.                                 0000 0110 010
                                    0000 0000 000
18.                                  000 0110 0100
                                     000 0000 0000
19.                                   00 0110 0100 0
                                      00 0000 0000 0
```

TABLE 2-3-continued

| | |
|---|---|
| 20. | 0 0110 0100 00 |
| | 0 0000 0000 00 |
| 21. | 0110 0100 000 |
| | 0000 0000 000 |
| 22. Error Trapped: | 110 0100 0000 |
| | 111 0110 1001 |
| 23. | 01 0010 1001 0 |
| | 00 0000 0000 0 |
| 24. | 1 0010 1001 00 |
| | 1 1101 1010 01 |
| 25. | 1111 0011 010 |
| | 1110 1101 001 |
| 26. | 001 1110 0110 |
| | 000 0000 0000 |
| 27. | 01 1110 0110 0 |
| | 00 0000 0000 0 |
| 28. | 1 1110 0110 00 |
| | 1 1101 1010 01 |
| 29. | 0011 1100 010 |
| | 0000 0000 000 |
| 30. | 011 1100 0100 |
| | 000 0000 0000 |
| 31. | 11 1100 0100 0 |

When a pattern of $\lceil \log_2 n \rceil$ zeros is detected in a syndrome, potential errors are located in predetermined bit positions of the received word. With the POCSAG format of 31-bit cyclic words, a pattern of five consecutive zero digits in a syndrome indicates the location of potential error bits in the received word. The remaining $[(n-k)-\lceil \log_2 n \rceil]$ bit positions of the syndrome, or summing bits, are added, in modulo 2, to predetermined bit positions in the received word to generate an alternate, or potentially correct word. The bit positions of the received word to which the summing bits are added correspond to the bits positions of the summing bits in the syndrome, and are offset one bit position every time a new syndrome is generated. A one-to-one correspondence exists between the bit positions of the summing bits and the bit positions in the received word to which the summing bits are added after the generation of the first syndrome.

The abbreviations RW(9:5), S(9:5), and CB(9:5) respectively represent received word, syndrome, and corrected burst. The numbers inside the parenthesis represent the bit positions in a digital word, and include all the bit positions between the numbers in the parenthesis. For example, RW(9:5) represents bit positions 5, 6, 7, 8, and 9 of the received word.

An illustration of the correspondence between the syndrome and the received word in the POCSAG format follows. Bit positions 5–9 of the syndrome S(9:5) are the summing bits which are added to bit positions 5–9 of the received word RW(9:5), when the locating bits in the syndrome are in bit positions 0–4, S(4:0). The corresponding bit positions in the received word shift one position in significance with respect to the bit positions of the summing bits for each syndrome generated thereafter. An example of this error trapping process is presented in Tables 2-3, 2-4, 2-5, and 2-6 below.

TABLE 2-4

Received Codeword Register Contents 1. 011 1101 0100 1000 0110 0000 1100 1000
2. 111 1010 1001 0000 1100 0001 1001 0110
3. 111 0101 0010 0001 1000 0011 0010 1101
4. 110 1010 0100 0011 0000 0110 0101 1011
5. 101 0100 1000 0110 0000 1100 1011 0111
6. 010 1001 0000 1100 0001 1001 0110 1111
7. 101 0010 0001 1000 0011 0010 1101 1110
8. 010 0100 0011 0000 0110 0101 1011 1101
9. 100 1000 0110 0000 1100 1011 0111 1010
10. 001 0000 1100 0001 1001 0110 1111 0101
11. 010 0001 1000 0011 0010 1101 1110 1010
12. 100 0011 0000 0110 0101 1011 1101 0100
13. 000 0110 0000 1100 1011 0111 1010 1001
14. 000 1100 0001 1001 0110 1111 0101 0010
15. 001 1000 0011 0010 1101 1110 1010 0100
16. 011 0000 0110 0101 1011 1101 0100 1000
17. 110 0000 1100 1011 0111 1010 1001 0000
18. 100 0001 1001 0110 1111 0101 0010 0001
19. 000 0011 0010 1101 1110 1010 0100 0011
20. 000 0110 0101 1011 1101 0100 1000 0110
21. 000 1100 1011 0111 1010 1001 0000 1100
22. 001 1001 0110 1111 0101 0010 0001 1000
23. 011 0010 1101 1110 1010 0100 0011 0000
24. 110 0101 1011 1101 0100 1000 0110 0000
25. 100 1011 0111 1010 1001 0000 1100 0001
26. 001 0110 1111 0101 0010 0001 1000 0011
27. 010 1101 1110 1010 0100 0011 0000 0110
28. 101 1011 1101 0100 1000 0110 0000 1100
29. 011 0111 1010 1001 0000 1100 0001 1001
30. 110 1111 0101 0010 0001 1000 0011 0010
31. 101 1110 1010 0100 0011 0000 0110 0101

TABLE 2-5

First Storage Register

1. XXX XXXX XXXX XXXX XXXX XXXX XXXX XXXX
2. XXX XXXX XXXX XXXX XXXX XXXX XXXX XXXX
3. XXX XXXX XXXX XXXX XXXX XXXX XXXX XXXX
4. XXX XXXX XXXX XXXX XXXX XXXX XXXX XXXX
5. XXX XXXX XXXX XXXX XXXX XXXX XXXX XXXX
6. XXX XXXX XXXX XXXX XXXX XXXX XXXX XXXX
7. XXX XXXX XXXX XXXX XXXX XXXX XXXX XXXX
8. XXX XXXX XXXX XXXX XXXX XXXX XXXX XXXX
9. XXX XXXX XXXX XXXX XXXX XXXX XXXX XXXX
10. XXX XXXX XXXX XXXX XXXX XXXX XXXX XXXX
11. XXX XXXX XXXX XXXX XXXX XXXX XXXX XXXX
12. XXX XXXX XXXX XXXX XXXX XXXX XXXX XXXX
13. XXX XXXX XXXX XXXX XXXX XXXX XXXX XXXX
14. XXX XXXX XXXX XXXX XXXX XXXX XXXX XXXX
15. XXX XXXX XXXX XXXX XXXX XXXX XXXX XXXX

TABLE 2-5-continued

First Storage Register

| |
|---|
| 16. XXX XXXX XXXX XXXX XXXX XXXX XXXX XXXX |
| 17. XXX XXXX XXXX XXXX XXXX XXXX XXXX XXXX |
| 18. XXX XXXX XXXX XXXX XXXX XXXX XXXX XXXX |
| 19. XXX XXXX XXXX XXXX XXXX XXXX XXXX XXXX |
| 20. XXX XXXX XXXX XXXX XXXX XXXX XXXX XXXX |
| 21. XXX XXXX XXXX XXXX XXXX XXXX XXXX XXXX |
|     001 1001 0110 1111 0101 0010 0001 1000    (rotated received word) |
|     11 001    (summing bits) |
| 22. 001 1001 0110 1111 0101 0001 0011 1000 |
| 23. 011 0010 1101 1110 1010 0010 0111 0000 |
| 24. 110 0101 1011 1101 0100 0100 1110 0000 |
| 25. 100 1011 0111 1010 1000 1001 1100 0001 |
| 26. 001 0110 1111 0101 0001 0011 1000 0011 |
| 27. 010 1101 1110 1010 0010 0111 0000 0110 |
| 28. 101 1011 1101 0100 0100 1110 0000 1100 |
| 29. 011 0111 1010 1000 1001 1100 0001 1001 |
| 30. 110 1111 0101 0001 0011 1000 0011 0010 |
| 31. 101 1110 1010 0010 0111 0000 0110 0101 |
|     011 1101 0100 0100 1110 0000 1100 1011    (final alternate word) |

TABLE 2-6

Second Storage Register

| |
|---|
| 1. XXX XXXX XXXX XXXX XXXX XXXX XXXX XXXX |
| 2. XXX XXXX XXXX XXXX XXXX XXXX XXXX XXXX |
| 3. XXX XXXX XXXX XXXX XXXX XXXX XXXX XXXX |
| 4. XXX XXXX XXXX XXXX XXXX XXXX XXXX XXXX |
| 5. XXX XXXX XXXX XXXX XXXX XXXX XXXX XXXX |
| 6. XXX XXXX XXXX XXXX XXXX XXXX XXXX XXXX |
| 7. XXX XXXX XXXX XXXX XXXX XXXX XXXX XXXX |
| 8. XXX XXXX XXXX XXXX XXXX XXXX XXXX XXXX |
| 9. XXX XXXX XXXX XXXX XXXX XXXX XXXX XXXX |
| 10. XXX XXXX XXXX XXXX XXXX XXXX XXXX XXXX |
| 11. XXX XXXX XXXX XXXX XXXX XXXX XXXX XXXX |
| 12. XXX XXXX XXXX XXXX XXXX XXXX XXXX XXXX |
| 13. XXX XXXX XXXX XXXX XXXX XXXX XXXX XXXX |
| 14. XXX XXXX XXXX XXXX XXXX XXXX XXXX XXXX |
| 15. XXX XXXX XXXX XXXX XXXX XXXX XXXX XXXX |
| 16. XXX XXXX XXXX XXXX XXXX XXXX XXXX XXXX |
| 17. XXX XXXX XXXX XXXX XXXX XXXX XXXX XXXX |
| 18. XXX XXXX XXXX XXXX XXXX XXXX XXXX XXXX |
| 19. XXX XXXX XXXX XXXX XXXX XXXX XXXX XXXX |
| 20. XXX XXXX XXXX XXXX XXXX XXXX XXXX XXXX |
| 21. XXX XXXX XXXX XXXX XXXX XXXX XXXX XXXX |
| 22. XXX XXXX XXXX XXXX XXXX XXXX XXXX XXXX |
| 23. XXX XXXX XXXX XXXX XXXX XXXX XXXX XXXX |
| 24. XXX XXXX XXXX XXXX XXXX XXXX XXXX XXXX |
| 25. XXX XXXX XXXX XXXX XXXX XXXX XXXX XXXX |
| 26. XXX XXXX XXXX XXXX XXXX XXXX XXXX XXXX |
| 27. XXX XXXX XXXX XXXX XXXX XXXX XXXX XXXX |
| 28. XXX XXXX XXXX XXXX XXXX XXXX XXXX XXXX |
| 29. XXX XXXX XXXX XXXX XXXX XXXX XXXX XXXX |
| 30. XXX XXXX XXXX XXXX XXXX XXXX XXXX XXXX |
| 31. XXX XXXX XXXX XXXX XXXX XXXX XXXX XXXX |

Table 2-3 presents the generation of 5-consecutive zero bits in syndrome twenty two. The five least significant bit positions of the syndrome, S(4:0), are the locating bits of syndrome twenty two. The syndrome is a cyclic word so the highest significant bit position is considered consecutive to the least significant bit. Therefore, 5-consecutive bits can also be considered to be detected in syndromes 17–21. Any of syndromes 17–22 can be used for error trapping, and yield the same end result. For the purposes of clarity and consistency, the locating bits, as used herein, shall be the $\lceil \log_2 n \rceil$ least significant bit positions of the syndrome.

If the five least significant bit positions in syndrome twenty two are the locating bits, then the five most significant bits, S(9:5), are the summing bits. Table 2-5 shows the summing bits being added to the received word in the receive register to yield an alternate word. The five most significant bits in syndrome twenty two are added, in modulo 2, to the numbers in the 5–9 bit positions in the received word to generate the alternate word. The alternate word is then loaded into the 1st storage register, before the generation of the twenty third syndrome.

Table 2-4 shows that the received word is rotated after the generation of every syndrome. The word is rotated by inserting the number in the most significant bit position into the least significant bit position, and shifting all the other numbers one bit position higher in significance. The received word is rotated as a convenient means of tracking the correspondence between the summing bit and the portion of the received word to which the summing bits are added. By rotating the received word, the summing bits are always added to numbers in the same bit positions of the received word. That is, S(9:5) is always added to RW(9:5). Alternately, rather than rotating the received word after the generation of each syndrome, the summing bits could be added to the received word through offsetting the bit positions of the received word by the number of syndromes generated. Using the alternate word generated in Table 2-4 as an example, if the received word is not rotated, then summing bits S(9:5) would be added to numbers in the received word bit positions 21-places lower in significance. The number twenty one corresponds to the generation of twenty one additional syndromes after the first syndrome. Since the received word is a 31 bit cyclic word, moving 21 places lower in significance is the same as moving 10 positions higher in significance. Therefore, the summing bits S(9:5) would be added to RW(19:15) if the numbers in the receive register were not rotated every time a new syndrome was produced.

Using the rotated received word method, the alternate word, once generated must continue to be rotated every time a new syndrome is generated, see Table 2-5. The word in the alternate word storage register, after the generation of the last syndrome, is the corrected word and needs no further rotation. Tables 2-4, 2-5, and 2-6 are combined in Table 2-7 to show the simultaneous rotation of the words in the registers with the generation of each new syndrome.

Table 2 presents an example of a $[(n-k)-\lceil \log_2 n \rceil]$ error burst that is correctable using prior art error trapping techniques. Table 3 presents an example of the prior art methods failing to correct a $[(n-k)-\lceil \log_2 n \rceil]$ error burst.

Table 3-1 shows a 32-bit transmitted word comprising a 31-bit cyclic word, and a parity bit in the least significant bit position. 5-bits in a 5-bit burst pattern are corrupted to yield the received word. In Table 3-2 the received word is divided by the generating polynomial to obtain a first syndrome. New syndromes are produced by dividing the previous syndrome by the generating polynomial, as depicted in Table 3-3. Since the cyclic word has 31-bit positions, thirty one syndromes must be derived to check thirty one different bursts of 5-bit positions. The error trapping process yields a pattern of five zero bits in syndrome six. The numbers in the other 5-bit positions of syndrome six, the summing bits S(9:5), are added in modulo 2 to predetermine bit positions in the received word, RW(9:5), as can be seen in Table 3-5. Note, the location bits S(4:0) are also all zeros in syndromes four and five. Performing the error correction process on either of these two syndromes yields the same end result as using syndrome six. That is, the correction of the received word with syndrome of four, five, and six all yield the same result. Likewise, performing error trapping with all three syndromes yields the same result.

TABLE 2-7

| | 1st Storage Register | 2nd Storage Register | Received Codeword Register Contents | | | | | | | |
|---|---|---|---|---|---|---|---|---|---|---|
| 1. | XXX XXXX XXXX XXXX XXXX XXXX XXXX XXXX | XXX XXXX XXXX XXXX XXXX XXXX XXXX XXXX | 011 | 1101 | 0100 | 1000 | 0110 | 0000 | 1100 | 1011 |
| 2. | XXX XXXX XXXX XXXX XXXX XXXX XXXX XXXX | XXX XXXX XXXX XXXX XXXX XXXX XXXX XXXX | 111 | 1010 | 1001 | 0000 | 1100 | 0001 | 1001 | 0110 |
| 3. | XXX XXXX XXXX XXXX XXXX XXXX XXXX XXXX | XXX XXXX XXXX XXXX XXXX XXXX XXXX XXXX | 111 | 0101 | 0010 | 0001 | 1000 | 0011 | 0010 | 1101 |
| 4. | XXX XXXX XXXX XXXX XXXX XXXX XXXX XXXX | XXX XXXX XXXX XXXX XXXX XXXX XXXX XXXX | 110 | 1010 | 0100 | 0011 | 0000 | 0110 | 0101 | 1011 |
| 5. | XXX XXXX XXXX XXXX XXXX XXXX XXXX XXXX | XXX XXXX XXXX XXXX XXXX XXXX XXXX XXXX | 101 | 0100 | 1000 | 0110 | 0000 | 1100 | 1011 | 0111 |
| 6. | XXX XXXX XXXX XXXX XXXX XXXX XXXX XXXX | XXX XXXX XXXX XXXX XXXX XXXX XXXX XXXX | 010 | 1001 | 0000 | 1100 | 0001 | 1001 | 0110 | 1111 |
| 7. | XXX XXXX XXXX XXXX XXXX XXXX XXXX XXXX | XXX XXXX XXXX XXXX XXXX XXXX XXXX XXXX | 101 | 0010 | 0001 | 1000 | 0011 | 0010 | 1101 | 1110 |
| 8. | XXX XXXX XXXX XXXX XXXX XXXX XXXX XXXX | XXX XXXX XXXX XXXX XXXX XXXX XXXX XXXX | 010 | 0100 | 0011 | 0000 | 0110 | 0101 | 1011 | 1101 |
| 9. | XXX XXXX XXXX XXXX XXXX XXXX XXXX XXXX | XXX XXXX XXXX XXXX XXXX XXXX XXXX XXXX | 100 | 1000 | 0110 | 0000 | 1100 | 1001 | 1011 | 1010 |
| 10. | XXX XXXX XXXX XXXX XXXX XXXX XXXX XXXX | XXX XXXX XXXX XXXX XXXX XXXX XXXX XXXX | 001 | 0001 | 1100 | 0001 | 1001 | 0110 | 0111 | 0101 |
| 11. | XXX XXXX XXXX XXXX XXXX XXXX XXXX XXXX | XXX XXXX XXXX XXXX XXXX XXXX XXXX XXXX | 010 | 0011 | 1000 | 0011 | 0010 | 0101 | 1110 | 1010 |
| 12. | XXX XXXX XXXX XXXX XXXX XXXX XXXX XXXX | XXX XXXX XXXX XXXX XXXX XXXX XXXX XXXX | 100 | 0110 | 0000 | 0000 | 0101 | 1011 | 1101 | 0100 |
| 13. | XXX XXXX XXXX XXXX XXXX XXXX XXXX XXXX | XXX XXXX XXXX XXXX XXXX XXXX XXXX XXXX | 000 | 0110 | 0000 | 1100 | 1011 | 0111 | 1010 | 1001 |
| 14. | XXX XXXX XXXX XXXX XXXX XXXX XXXX XXXX | XXX XXXX XXXX XXXX XXXX XXXX XXXX XXXX | 000 | 1100 | 0001 | 1001 | 0110 | 1111 | 0101 | 0010 |
| 15. | XXX XXXX XXXX XXXX XXXX XXXX XXXX XXXX | XXX XXXX XXXX XXXX XXXX XXXX XXXX XXXX | 001 | 1000 | 0011 | 0010 | 1101 | 1110 | 1010 | 0100 |
| 16. | XXX XXXX XXXX XXXX XXXX XXXX XXXX XXXX | XXX XXXX XXXX XXXX XXXX XXXX XXXX XXXX | 011 | 0000 | 0110 | 0101 | 1011 | 1101 | 0100 | 1000 |
| 17. | XXX XXXX XXXX XXXX XXXX XXXX XXXX XXXX | XXX XXXX XXXX XXXX XXXX XXXX XXXX XXXX | 110 | 0000 | 1100 | 1011 | 0111 | 1010 | 1001 | 0000 |

TABLE 2-7-continued

| | 1st Storage Register | 2nd Storage Register | Received Codeword Register Contents |
|---|---|---|---|
| 18. | xxx xxxx xxxx xxxx xxxx xxxx xxxx xxxx xxxx | xxx xxxx xxxx xxxx xxxx xxxx xxxx xxxx xxxx | 100 0001 1001 0110 1111 0101 0010 0001 |
| 19. | xxx xxxx xxxx xxxx xxxx xxxx xxxx xxxx xxxx | xxx xxxx xxxx xxxx xxxx xxxx xxxx xxxx xxxx | 000 0011 0010 1101 1110 1010 0100 0011 |
| 20. | xxx xxxx xxxx xxxx xxxx xxxx xxxx xxxx xxxx | xxx xxxx xxxx xxxx xxxx xxxx xxxx xxxx xxxx | 000 0110 0101 1011 1101 1010 1000 0110 |
| 21. | xxx xxxx xxxx xxxx xxxx xxxx xxxx xxxx xxxx | xxx xxxx xxxx xxxx xxxx xxxx xxxx xxxx xxxx | 000 1100 1011 0111 1011 0101 0001 1100 |
| 22. | 001 1001 0110 1111 0101 0001 0011 1000 | xxx xxxx xxxx xxxx xxxx xxxx xxxx xxxx xxxx | 001 1001 0110 1111 1110 1010 0011 1000 |
| 23. | 011 0010 1101 1110 1010 0010 0111 0000 | xxx xxxx xxxx xxxx xxxx xxxx xxxx xxxx xxxx | 011 0010 0101 1101 1110 1101 0100 0000 |
| 24. | 110 0101 1011 1101 0100 0100 1110 0000 | xxx xxxx xxxx xxxx xxxx xxxx xxxx xxxx xxxx | 110 0101 1011 1010 1101 1010 1000 0000 |
| 25. | 100 1011 0111 1010 1000 1001 1100 0001 | xxx xxxx xxxx xxxx xxxx xxxx xxxx xxxx xxxx | 100 1011 0111 0101 1010 1001 0000 0001 |
| 26. | 001 0110 1111 0101 0001 0011 1000 0011 | xxx xxxx xxxx xxxx xxxx xxxx xxxx xxxx xxxx | 001 0110 1111 1110 0101 0010 0001 0011 |
| 27. | 010 1101 1110 1010 0010 0111 0000 0110 | xxx xxxx xxxx xxxx xxxx xxxx xxxx xxxx xxxx | 010 1101 1101 1110 1010 0100 0011 0110 |
| 28. | 101 1011 1101 0100 0100 1110 0000 1100 | xxx xxxx xxxx xxxx xxxx xxxx xxxx xxxx xxxx | 101 1011 1010 1101 1010 1000 0000 1100 |
| 29. | 011 0111 1010 1000 1001 1100 0001 1001 | xxx xxxx xxxx xxxx xxxx xxxx xxxx xxxx xxxx | 011 0111 0101 1010 1001 0000 0001 1001 |
| 30. | 110 1111 0101 0001 0011 1000 0011 0010 | xxx xxxx xxxx xxxx xxxx xxxx xxxx xxxx xxxx | 110 1111 1110 0101 0010 0001 0011 0010 |
| 31. | 101 1110 1010 0000 0110 0000 0110 0101 | xxx xxxx xxxx xxxx xxxx xxxx xxxx xxxx xxxx | 101 1110 1010 0100 0011 0101 0110 0101 |
| | 011 1101 0100 0100 1110 0000 1100 1011 | xxx xxxx xxxx xxxx xxxx xxxx xxxx xxxx xxxx | 001 1001 0110 1111 1111 0101 0000 1000 |

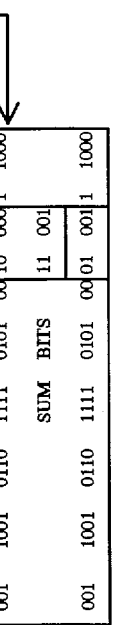

SUM BITS

TABLE 3-1

|  | P |
|---|---|
| Transmitted codeword: | 011 1101 0100 0100 1110 0000 1100 1011 1 |
| Corrupted bits: | 1111 1 |
| Received codeword: | 011 0010 1100 0100 1110 000 1100 1011 1 |

TABLE 3-2

```
                              0 1011 0000 1010 1100 0111
11 0110 1001 )011 0010 1100 0100 1110 0000 1100 1011
              000 0000 0000
              11 0010 1100 0
              11 1011 0100 1
               0 1001 1000 11
               0 0000 0000 00
                 1001 1000 110
                 1110 1101 001
                  111 0101 1110
                  111 0110 1001
                   00 0011 0111 1
                   00 0000 0000 0
                    0 0011 0111 11
                    0 0000 0000 00
                      0011 0111 111
                      0000 0000 000
                       011 0111 1110
                       000 0000 0000
                        11 0111 1110 0
                        11 1011 0100 1
                         0 1100 1010 10
                         0 0000 0000 00
                           1100 1010 100
                           1110 1101 001
                            010 0111 1010
                            000 0000 0000
                             10 0111 1010 1
                             11 1011 0100 1
                              1 1100 1110 01
                              1 1101 1010 01
                                0001 0100 000
                                0000 0000 000
                                 001 0100 0000
                                 000 0000 0000
                                  01 0100 0000 1
                                  00 0000 0000 0
                                   1 0100 0000 10
                                   1 1101 1010 01
                                     1001 1010 111
                                     1110 1101 001
                                      111 0111 1101
                                      111 0110 1001
First Syndrome:                        00 0001 0100
```

TABLE 3-3

```
                            00 0001 1100 0001 0011 1011 0001 1010
111 0110 1001 )0000 0101 0000 0000 0000 0000 0000 0000 0000
               0000 0000 000
2.              000 0101 0000
                000 0000 0000
3.               00 0101 0000 0
                 00 0000 0000 0
4.                0 0101 0000 00
                  0 0000 0000 00
5.                  0101 0000 000
                    0000 0000 000
6. Error Trapped:   101 0000 0000
                    111 0110 1001
7.                   10 0110 1001 0
                     11 1011 0100 1
8.                    1 1101 1101 10
                      1 1101 1010 01
```

TABLE 3-3-continued

```
9.                      0000 0111 110
                        0000 0000 000
10.                      000 0111 1100
                         000 0000 00000        Syndrome No.
11.                       00 0111 1100 0
                          00 0000 0000 0
12.                        0 0111 1100 00
                           0 0000 0000 00
13.                          0111 1100 000
                             0000 0000 000
14. Error Trapped:           111 1100 0000
                             111 0110 1001
15.                           00 1010 1001 0
                              00 0000 0000 00
16.                            0 1010 1001 00
                               0 0000 0000 00
17.                              1010 1001 000
                                 1110 1101 001
18.                               100 0100 0010
                                  111 0110 1001
19.                                11 0010 1011 0
                                   11 1011 0100 1
20.                                 0 1001 1111 10
                                    0 0000 0000 00
21.                                   1001 1111 100
                                      1110 1101 001
22.                                    111 0010 1010
                                       111 0110 1001
23.                                     00 0100 0011 0
                                        00 0000 0000 0
24.                                      0 0100 0011 00
                                         0 0000 0000 00
25.                                        0100 0011 000
                                           0000 0000 000
26.                                         100 0011 0000
                                            111 0110 1001
27.                                          11 0101 1001 0
                                             11 1011 0100 1
28.                                           0 1110 1101 10
                                              0 0000 0000 00
29.                                             1110 1101 100
                                                1110 1101 001
30.                                              000 0000 1010
                                                 000 0000 0000
31.                                               00 0000 1010
```

TABLE 3-4

Received Codeword Register Contents 1. 011 0010 1100 0100 1110 0000 1100 1011
2. 110 0101 1000 1001 1100 0001 1001 0110
3. 100 1011 0001 0011 10000 0011 0010 1101
4. 001 0110 0010 0111 0000 0110 0101 1011
5. 010 1100 0100 1110 0000 1100 1011 0110
6. 101 1000 1001 1100 0001 1001 0110 1100
7. 011 0001 0011 1000 0011 0010 1101 1001
8. 110 0010 0111 0000 0110 0101 1011 0010
9. 100 0100 1110 0000 1100 1011 0110 0101
10. 000 1001 1100 0001 1001 0110 1100 1011
11. 001 0011 10000 0011 0010 1101 1001 0110
12. 010 0111 0000 0110 0101 1011 0010 1100
13. 100 1110 0000 1100 1011 0110 0101 1000
14. 001 1100 0001 1001 0110 1100 1011 0001
15. 011 1000 0011 0010 1101 1001 0110 0010
16. 111 0000 0110 0101 1011 0010 1100 0100
17. 110 0000 1100 1011 0110 0101 1000 1001
18. 100 0001 1001 0110 1100 1011 0001 0011
19. 000 0011 0010 1101 1001 0110 0010 0111
20. 000 0110 0101 1011 0010 1100 0100 1110
21. 000 1100 1011 0110 0101 1000 1001 1100
22. 001 1001 0110 1100 1011 0001 0011 1000
23. 011 0010 1101 1001 0110 0010 0111 0000
24. 110 0101 1011 0010 1100 0100 1110 0000
25. 100 1011 0110 0101 1000 1001 1100 0001
```

TABLE 3-4-continued

Received Codeword Register Contents 26. 001 0110 1100 1011 0001 0011 1000 0011
27. 010 1101 1001 0110 0010 0111 0000 0110
28. 101 1011 0010 1100 0100 1110 0000 1100
29. 011 0110 0101 1000 1001 1100 0001 1001
30. 110 1100 1011 0001 0011 10000 0011 0010
31. 101 1001 0110 0010 0111 00000 0110 0101

TABLE 3-5

First Storage Register

1. XXX XXXX XXXX XXXX XXXX XXXX XXXX XXXX
2. XXX XXXX XXXX XXXX XXXX XXXX XXXX XXXX
3. XXX XXXX XXXX XXXX XXXX XXXX XXXX XXXX
4. XXX XXXX XXXX XXXX XXXX XXXX XXXX XXXX
5. XXX XXXX XXXX XXXX XXXX XXXX XXXX XXXX
   101 1000 1001 1100 0001 1001 0110 1100    (rotated received word)
   <sup>11</sup> 10 100    (summing bits)
6. 101 1000 1001 1100 0001 1011 1110 1100
7. 0.11 0001 0011 1000 0011 0111 1101 1001
8. 110 0010 0111 0000 0110 1111 1011 0010
9. 100 0100 1110 0000 1101 1111 0110 0101
10. 000 1001 1100 0001 1011 1110 1100 1011
11. 001 0011 10000 0011 0111 1101 1001 0110
12. 010 0111 0000 0110 1111 1011 0010 1100
13. 100 1110 0000 1101 1111 0110 0101 1000
14. 001 1100 0001 1011 1110 1100 1011 0001
15. 011 10000 0011 0111 1101 1001 0110 0010
16. 111 0000 0110 1111 1011 0010 1100 0100
17. 110 0000 1101 1111 0110 0101 1000 1001
18. 100 0001 1011 1110 11000 1011 0001 0011
19. 000 0011 0111 1101 1001 0110 0010 0111
20. 000 0110 1111 1011 0010 1100 0100 1110
21. 000 1101 1111 0110 0101 1000 1001 1100
22. 001 1011 1110 1100 1011 0001 0011 1000
23. 011 0111 1101 1001 0110 0010 0111 0000
24. 110 1111 1011 0010 1100 0100 1110 0000
25. 101 1111 0110 0101 1000 1001 1100 0001
26. 011 1110 1100 1011 0001 0011 1000 0011
27. 111 1101 1001 0110 0010 0111 0000 0110
28. 111 1011 0010 1100 0100 1110 0000 1101
29. 111 0110 0101 1000 1001 1100 0001 1011
30. 110 1100 1011 0001 0011 1000 0011 0111
31. 101 1001 0110 0010 0111 0000 0110 1111

011 0010 1100 0100 1110 0000 1101 1111    (final alternate word)

The alternate word created by summing S(9:5) with the rotated word RW(9:5) is saved in the first storage register, as shown in Table 3-5. As in the example presented in Table 2, the alternate word in the first register is rotated upon the generation of each new syndrome so that the numbers in the bit positions of the alternate word are in the proper order after the generation of the last syndrome.

Unlike the example presented in Table 2, a second pattern of zeros, independent of the first detected pattern, is found in syndromes 9-14. Any of syndromes 9-14 can be used to yield the same alternate word. As above, a syndrome with the zero bits in the least significant positions of the syndrome, S(4:0), is used. Summing bits S(9:5) of syndrome fourteen are added to the rotating received word, in Table 3-6, to create an alternate word which is stored in the second storage register. The second alternate word is rotated upon the generation of each new syndrome. Although the error trapping process has identified two alternate words as possible corrections to the received code word, only one of the alternate words is correct. There is nothing in the above process to recommend one alternate word over the other. The possibility of producing two alternate words when error bursts of [(n−k)−⌈log₂ n⌉] bits, or 5-bits with POCSAG words, is the prior art problem that the present invention addresses. Tables 3-4, 3-5, and 3-6 are combined in Table 3-7 to illustrate the simultaneous rotation of the words in the registers with the generation of each new syndrome.

TABLE 3-6

Second Storage Register

1. XXX XXXX XXXX XXXX XXXX XXXX XXXX XXXX
2. XXX XXXX XXXX XXXX XXXX XXXX XXXX XXXX
3. XXX XXXX XXXX XXXX XXXX XXXX XXXX XXXX
4. XXX XXXX XXXX XXXX XXXX XXXX XXXX XXXX
5. XXX XXXX XXXX XXXX XXXX XXXX XXXX XXXX
6. XXX XXXX XXXX XXXX XXXX XXXX XXXX XXXX
7. XXX XXXX XXXX XXXX XXXX XXXX XXXX XXXX
8. XXX XXXX XXXX XXXX XXXX XXXX XXXX XXXX
9. XXX XXXX XXXX XXXX XXXX XXXX XXXX XXXX
10. XXX XXXX XXXX XXXX XXXX XXXX XXXX XXXX
11. XXX XXXX XXXX XXXX XXXX XXXX XXXX XXXX
12. XXX XXXX XXXX XXXX XXXX XXXX XXXX XXXX
13. XXX XXXX XXXX XXXX XXXX XXXX XXXX XXXX
    001 1100 0001 1001 0110 1100 1011 0001   (rotated received word)
    $^{11}$ 11 111   (summing bits)
14. 001 1100 0001 1001 0110 1111 0101 0001
15. 011 1000 0011 0010 1101 1110 1010 0010
16. 111 0000 0110 0101 1011 1101 0100 0100
17. 110 0000 1100 1011 0111 1010 10000 1001
18. 100 0001 1001 0110 1111 0101 0001 0011
19. 000 0011 0010 1101 1110 1010 0010 0111
20. 000 0110 0101 1011 1101 0100 0100 1110
21. 000 1100 1011 0111 1010 1000 1001 1100
22. 001 1001 0110 1111 0101 0001 0011 1000
23. 011 0010 1101 1110 1010 0010 0111 0000
24. 110 0101 1011 1101 0100 0100 1110 0000
25. 100 1011 0111 1010 1000 1001 1100 0001
26. 001 0110 1111 0101 0001 0011 1000 0011
27. 010 1101 1110 1010 0010 0111 0000 0110
28. 101 1011 1101 0100 0100 1110 0000 1100
29. 011 0111 1010 1000 1001 1100 0001 1001
30. 110 1111 0101 0001 0011 1000 0011 0010
31. 101 1110 1010 0010 0111 0000 0110 0101

011 1101 0100 0100 1110 0000 1100 1011   (final alternate word)

TABLE 3-7

| | 1st Storage Register | 2nd Storage Register | Received Codeword Register Contents |
|---|---|---|---|
| 1. | XXX XXXX XXXX XXXX XXXX XXXX XXXX XXXX | XXX XXXX XXXX XXXX XXXX XXXX XXXX XXXX | 011 0010 1100 0100 1110 0100 1100 1011 |
| 2. | XXX XXXX XXXX XXXX XXXX XXXX XXXX XXXX | XXX XXXX XXXX XXXX XXXX XXXX XXXX XXXX | 110 0101 1000 1001 1100 1001 1001 0110 |
| 3. | XXX XXXX XXXX XXXX XXXX XXXX XXXX XXXX | XXX XXXX XXXX XXXX XXXX XXXX XXXX XXXX | 100 1011 0001 0011 1000 0011 0010 1101 |
| 4. | XXX XXXX XXXX XXXX XXXX XXXX XXXX XXXX | XXX XXXX XXXX XXXX XXXX XXXX XXXX XXXX | 001 0110 0010 0111 0000 0110 1011 1011 |
| 5. | XXX XXXX XXXX XXXX XXXX XXXX XXXX XXXX | XXX XXXX XXXX XXXX XXXX XXXX XXXX XXXX | 010 1100 0100 1110 0000 1100 1011 0110 |
| 6. | 101 1000 1001 1100 0001 1011 1110 1100 | XXX XXXX XXXX XXXX XXXX XXXX XXXX XXXX | 101 1000 1001 1100 0001 1001 0110 1100 |
| 7. | 011 0001 0011 1000 0011 0111 1101 1001 | XXX XXXX XXXX XXXX XXXX XXXX XXXX XXXX | 011 0001 0011 0111 0011 0010 1101 1001 |
| 8. | 110 0010 0111 0000 0110 1111 1011 0010 | XXX XXXX XXXX XXXX XXXX XXXX XXXX XXXX | 110 0010 0110 1110 0110 0101 1011 0010 |
| 9. | 100 0100 1110 0000 1101 1111 0110 0101 | XXX XXXX XXXX XXXX XXXX XXXX XXXX XXXX | 100 0100 1100 1100 1100 1011 0110 0101 |
| 10. | 000 1001 1100 0001 1011 1110 1100 1011 | XXX XXXX XXXX XXXX XXXX XXXX XXXX XXXX | 000 1001 1001 1000 1001 0110 1100 1011 |
| 11. | 001 0011 1000 0011 0111 1101 1001 0110 | XXX XXXX XXXX XXXX XXXX XXXX XXXX XXXX | 001 0011 0011 0001 0011 0010 1101 0110 |
| 12. | 010 0111 0000 0110 1111 1011 0010 1100 | XXX XXXX XXXX XXXX XXXX XXXX XXXX XXXX | 010 0111 0110 0010 0110 0101 1011 1100 |
| 13. | 100 1110 0000 1101 1111 0110 0101 1000 | XXX XXXX XXXX XXXX XXXX XXXX XXXX XXXX | 100 1110 1100 0101 1100 1011 0110 1000 |
| 14. | 001 1100 0001 1011 1100 0110 1011 0001 | 001 1100 0110 1001 0110 1111 0101 0001 | 001 1100 0001 0011 1100 1011 0001 |
| 15. | 011 1000 0011 1101 1001 0110 0110 0011 | 011 1000 0011 1101 1011 1110 1010 0010 | 011 1000 0011 0110 1000 0010 0010 |
| 16. | 111 0000 0110 1011 0010 1100 0101 0100 | 111 0000 0110 1011 0111 1101 0100 0100 | 111 0000 1100 0101 0010 0010 0100 |
| 17. | 110 0000 1101 1011 0110 0101 1000 1001 | 110 0000 1101 0111 1111 1010 1000 1001 | 110 0000 1101 1011 0101 0101 1000 1001 |
| 18. | 100 0001 1011 1100 1011 1100 0001 0011 | 100 0001 1011 1111 1110 0101 0001 0011 | 100 0001 1011 1010 1011 1000 0001 0011 |
| 19. | 000 0011 0111 1001 0110 0010 0010 0111 | 000 0011 0111 1110 1101 1010 0010 0111 | 000 0011 0111 0001 0110 1100 0010 0111 |
| 20. | 000 0110 1111 0010 1100 0100 0100 1110 | 000 0110 1111 1101 1010 0100 0100 1110 | 000 0110 1100 0010 0101 0100 0100 1110 |

TABLE 3-7-continued

| | 1st Storage Register | | | | | 2nd Storage Register | | | | | Received Codeword Register Contents | | | | |
|---|---|---|---|---|---|---|---|---|---|---|---|---|---|---|---|
| 22. | 001 | 1011 | 1110 | 1100 | 1011 | 0001 | 0011 | 1000 | 001 | 1001 | 0110 | 1101 | 1111 | 0101 | 0001 | 0011 | 1000 | 001 | 1001 | 0110 | 1101 | 1111 | 0101 | 0001 | 0011 | 1000 |
| 23. | 011 | 0111 | 1101 | 1001 | 0110 | 0010 | 0111 | 0000 | 011 | 0010 | 1101 | 1011 | 1110 | 1010 | 0010 | 0111 | 0000 | 011 | 0010 | 1101 | 1011 | 1110 | 1010 | 0010 | 0111 | 0000 |
| 24. | 110 | 1111 | 1011 | 0010 | 1100 | 0100 | 1110 | 0000 | 110 | 0101 | 1011 | 1101 | 1010 | 0100 | 1000 | 1110 | 0000 | 110 | 0101 | 1011 | 1101 | 1010 | 0100 | 1000 | 1110 | 0000 |
| 25. | 101 | 1111 | 0110 | 0101 | 1000 | 1001 | 1100 | 0001 | 100 | 1011 | 0111 | 1111 | 1000 | 0001 | 1001 | 1100 | 0001 | 100 | 1011 | 0111 | 1111 | 1000 | 0001 | 1001 | 1100 | 0001 |
| 26. | 011 | 1110 | 1100 | 1011 | 1000 | 0011 | 1000 | 0011 | 001 | 0110 | 1111 | 1110 | 0101 | 1011 | 0011 | 0111 | 0110 | 001 | 0110 | 1111 | 1110 | 0101 | 1011 | 0011 | 0111 | 0110 |
| 27. | 111 | 1101 | 1001 | 0110 | 0010 | 0111 | 1110 | 0110 | 010 | 1101 | 1110 | 1101 | 1010 | 0010 | 0111 | 1110 | 0110 | 010 | 1101 | 1110 | 1101 | 1010 | 0010 | 0111 | 1110 | 0110 |
| 28. | 111 | 1011 | 0010 | 0100 | 1001 | 1110 | 0000 | 1101 | 101 | 1011 | 1101 | 1010 | 0100 | 1001 | 0010 | 0000 | 1100 | 101 | 1011 | 1101 | 1010 | 0100 | 1001 | 0010 | 0000 | 1100 |
| 29. | 111 | 0110 | 0101 | 1000 | 0011 | 1100 | 0001 | 1011 | 011 | 0111 | 1111 | 0101 | 1000 | 0001 | 0101 | 0001 | 1001 | 011 | 0111 | 1111 | 0101 | 1000 | 0001 | 0101 | 0001 | 1001 |
| 30. | 110 | 1100 | 1011 | 0001 | 1000 | 0000 | 0011 | 0010 | 110 | 1111 | 1111 | 0001 | 0001 | 1000 | 0001 | 0011 | 0010 | 110 | 1111 | 1111 | 0001 | 0001 | 1000 | 0001 | 0011 | 0010 |
| 31. | 101 | 1001 | 0110 | 0010 | 0111 | 0000 | 0110 | 0111 | 101 | 1110 | 1010 | 0010 | 0010 | 0000 | 0000 | 0110 | 0101 | 101 | 1110 | 1010 | 0010 | 0010 | 0000 | 0000 | 0110 | 0101 |
| FINAL Word | 011 | 0010 | 1100 | 0100 | 1110 | 0000 | 1101 | 1111 | 011 | 1101 | 0100 | 0100 | 1110 | 0001 | 0000 | 1101 | 1011 | 011 | 1000 | 1001 | 1100 | 0001 | 0100 | 1110 | 1100 | 1011 |

SUM BITS →

ALT word: 001 1100 0001 1001 0110 0110 1001 0011 1100 0001

Figure 3:
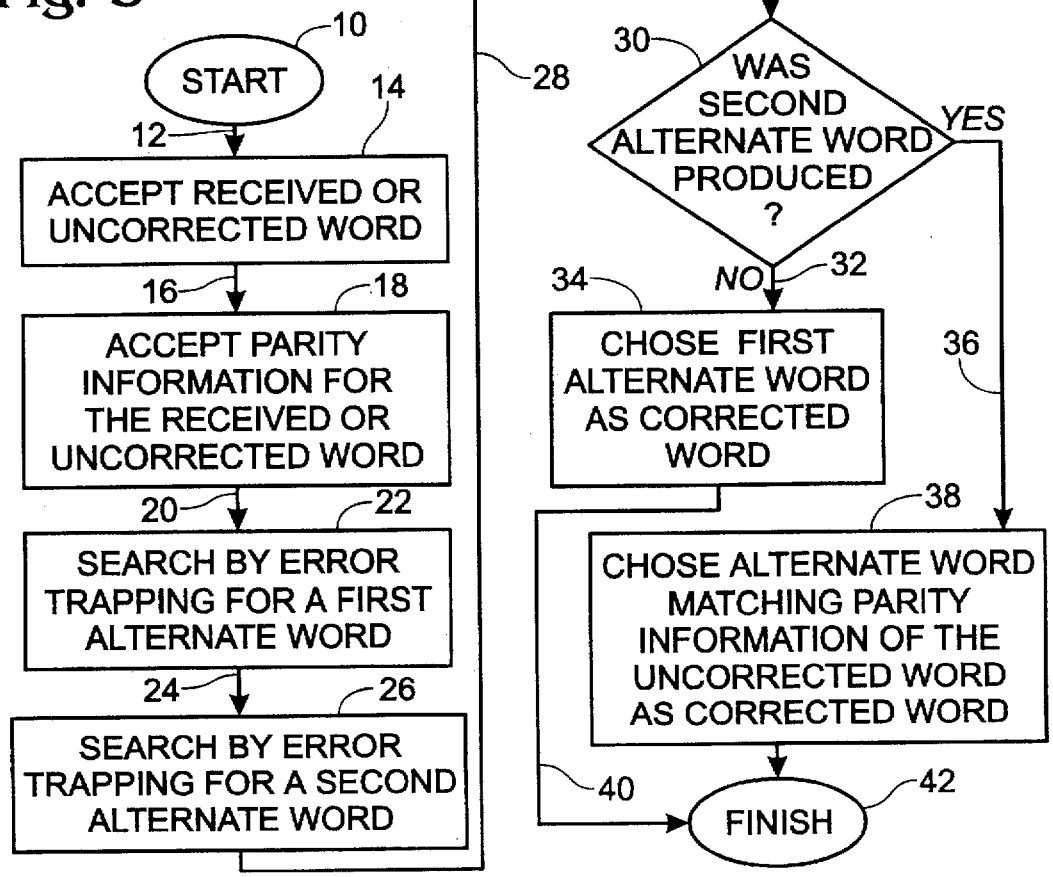
FIG. 3 is a flow diagram illustrating the operation of the system and method of the present invention to correct burst errors in digital information.

The value of the present method for correcting burst errors of up to $[(n-k)-\lceil \log_2 n \rceil]$ bit positions is that in situations where the prior art methods yield two alternate words, the method of the present invention allows a correct choice to be made between the alternate words. FIG. 3 shows a flow diagram illustrating the system and method of the present invention of correcting burst errors digital information. At the start 10 of the method information is received on line 12. The received or uncorrected words are accepted at a step 14. Line 16 joins step 14 to a step 18 of accepting parity information about the received or uncorrected word. Line 20 joins step 18 to the step 22 of searching by error trapping for a first burst of up to $[(n-k)-\lceil \log_2 n \rceil]$ bit positions in each uncorrected word and producing a first alternate word therefrom. Alternately, it can be said that step 22 is the searching by error trapping for the bit positions of a burst error of up to $[(n-k)-\lceil \log_2 n \rceil]$ bit positions in the received word, producing an alternate word therefrom, and measuring the parity of the alternate word. Yet another alternative statement of step 22 is that it is the searching by error trapping for the bit positions of bursts of up to 5-bit positions (in the POCSAG format) in each received word to produce a first parity alternate word. Step 22 is equivalent to the process, in Tables 3-3, 3-4, and 3-5, of locating an error in the sixth syndrome and the creation of the first alternate word in the first storage register. As will be further explained in FIG. 4, the (same) first alternate word can be generated for several successive syndromes. The first alternate word is equivalent to a first parity word, or an alternate word produced form a first burst error.

Returning to FIG. 3, a line 24 joins step 22 to a step 26 of searching by error trapping for a second burst of up to $[(n-k)-\lceil \log_2 n \rceil]$ bit positions in each uncorrected word, and if such a second burst is found, to produce a second alternate word therefrom. Alternately, step 26 is repeating the error trapping procedures for all n possible bit positions of the received word, producing up to n alternate words therefrom, and making up to n parity measurements of the alternate words. Yet another alternative statement of step 26 is that it is the searching by error trapping for the bit positions of bursts of up to 5-bit positions (in the POCSAG format) in each received word to produce a second parity alternate word. Step 26 is equivalent to the process, in Tables 3-3, 3-4, and 3-6, of locating an error in the fourteenth syndrome and the creation of a second alternate word in the second storage register. The remaining steps in the method illustrated in FIG. 3 allow the correct word to be selected from among the two alternate words in the two storage registers, and go to the heart of the present invention. As will be further explained in FIG. 4, the second alternate word can be produced by several successive syndromes. The distinguishing difference between first and second alternate words is their differing parities, and the second alternate word is equivalent to the second parity alternate word.

In FIG. 3, a line 28 joins step 26 to step 30, where it is determined whether a second burst error of up to $[(n-k)-\lceil \log_2 n \rceil]$ bit positions is found in step 26 (two alternate words produced). If not, then a line 32 is used to connect step 30 to a step 34 that chooses the first alternate word as the corrected word when no second burst error is found. Alternately, it can be said that when only one type of parity is measured in the production of alternate words, then line 32 is followed to connect step 30 to step 34 which selects any alternate word as the processed word. Yet another alternate statement of step 34 is that when (POCSAG) alternate words are produced in step 22, but not step 26, selecting the last produced alternate word as the processed word. This step is equivalent to the process, in Table 2, of selecting the alternate word in the first storage register when only one alternate word is produced by the error trapping process.

Returning to step 30, if two alternate words are generated in step 26 (a second burst error is found), or alternate words of both parity types are generated, a line 36 connects step 38 to a step that selects any alternate word with parity matching the parity information for the received, or uncorrected, word as the corrected word. Alternately, it can be said that step 38 selects as the corrected word, whichever of the first and second alternate words has a parity corresponding to the parity information of the uncorrected word. Yet another alternative statement of step 38 is that when alternate words are produced in steps 22 and 26, selecting the last produced alternate word having the parity of the received (POCSAG) word parity bit. Line 40 joins steps 34 and steps 38 to the finish of the process 42. Using the POCSAG format, if two alternate words are detected in step 30, the 32nd, or parity bit, of the POCSAG word is used to provide the parity information for the received word. Non-POCSAG systems can also use a parity bit to supply the parity information. Alternately, the parity information could be received through other communication channels, or the system could use only words of a single, known, parity.

Figure 4:
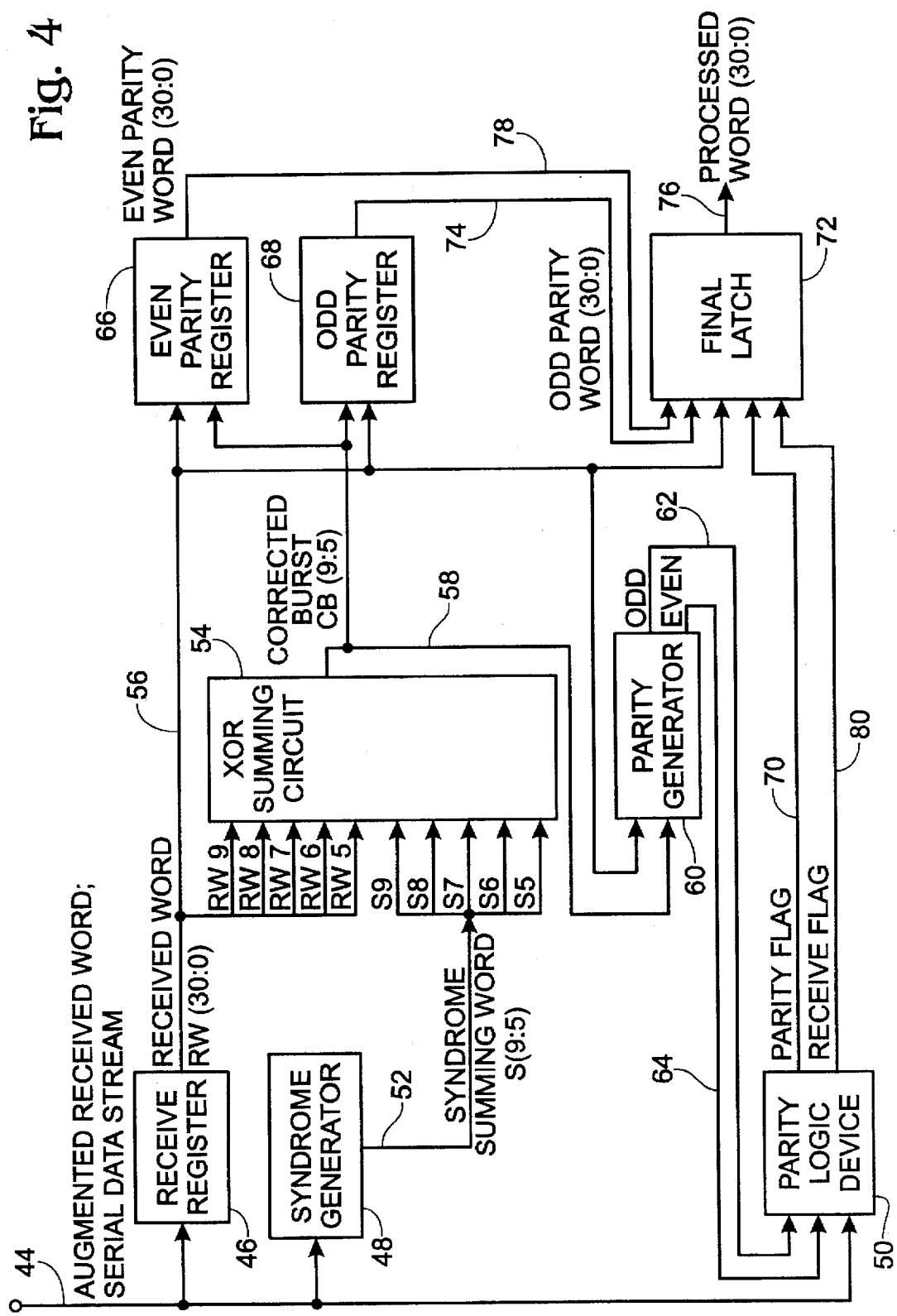
FIG. 4 is a schematic drawing of an apparatus to correct burst errors in digital information.

FIG. 4 is a schematic diagram of the apparatus to correct burst errors in digital information. Uncorrected (received words), including POCSAG words, are accepted on a line 44. Typically, this information is in a serial format with the most significant bit of the data words being received first in time. Alternately, the received words can be received in parallel format. The cyclic word portion of the received word is accepted into a receive register 46 and a syndrome generator 48. In terms of the POCSAG format, the 31-bit cyclic word is accepted by receive register 46 and syndrome generator 48, but not the 32nd (parity) bit. The parity bit or parity information on line 44 is received by parity logic device 50. Alternately, a parity bit or parity information can be supplied to parity logic device 50 from sources other than line 44. Upon receiving the complete received cyclic word, syndrome generator 48 derives n syndromes, of (n–k) bit positions, for the purpose of error trapping. Upon finding a pattern of $\lceil \log_2 n \rceil$ consecutive zero bits in the least significant bit positions of the syndrome, the summing bits, or the remaining bits of the syndrome are output on a line 52. In terms of the POCSAG format, 31-syndromes are generated, each syndrome comprising 10-bit positions. When the 5-least significant digits in the syndrome are zeros, the 5-most significant bits are output on a line 52 as summing bits to the XOR summing circuit 54.

Simultaneously with the acceptance of numbers from predetermined bit positions of the syndrome word, or summing bits, on line 52, summing circuit 54 accepts numbers from $[(n-k)-\lceil \log_2 n \rceil]$ predetermined bit positions of the received word. In terms of the POCSAG format, bit positions five through nine of the received word, RW(9:5), are input to summing circuit 54 on a line 56. Receive register 46 rotates the received word simultaneously with searching for the alternate words by error trapping through the generation of each new syndrome. In this manner, the potential error bits always occur in bit positions five through nine of the rotated received word. The received word, in received register 46, is rotated as the method of maintaining a pointer to the error bit positions in the received word. This rotation method reduces the number of gates needed to perform the pointing process.

Summing circuit 54 adds the summing bits on line 52 with the received word bits on line 56, in modulo 2, and outputs a corrected burst of [(n–k)-⌈log₂ n⌉] bit positions on a line 58. In terms of the POCSAG format, the corrected burst is 5-bit positions. The rotated received word on line 56, RW(30:0) and the corrected burst, CB(9:5), on line 58 are input to a parity generator 60. Parity generator 60 inserts the [(n–k)-⌈log₂ n⌉] numbers of the corrected burst into [(n–k)-⌈log₂ n⌉] predetermined bit positions of the rotated received word to produce an alternate word. In terms of the POCSAG format, CB(9:5) is inserted into bit positions RW(9:5) to produce an alternate word. Parity generator 60 then sums the numbers in the bit positions of the alternate word, in modulo 2, to produce the parity of the alternate word. If the parity of the alternate word is odd, a parity output sum is output on a line 62 to supply the parity logic device 50. If the parity of the alternate word is even, an even parity sum is output on a line 64 to supply parity logic device 50. Parity generator 60 operatively controls the loading of the parity registers with alternate words having the matching parity so that alternate words with odd parity are received into the odd parity register and alternate words with even parity are received into the even parity register, as described below.

The received word on line 56 and the corrected burst on line 58 are input to at least one register where alternate words and their respective parity can be tracked and stored. Preferably, separate registers are provided for alternate words of each parity. The rotated received, or uncorrected, word on line 56 is input to an even parity register 66 and an odd parity register 68. The corrected burst on line 58 is, likewise, input to even parity register 66 and odd parity register 68. Simultaneously with the generation of an odd parity sum on line 62, odd parity register 68 is enabled to accept the received word input on line 56 and corrected burst input on line 58. The numbers in the corrected burst are inserted into the predetermined (error bit) positions of the uncorrected word to generate an alternate word. In terms of the POCSAG format, CB(9:5) is inserted into RW(9:5) to generate an alternate word. The alternate word generated in odd parity register 68 is also stored in register 68, and rotated with the generation of each new syndrome by syndrome generator 48 simultaneously with the rotation of numbers in the receive register. The rotation of the alternate word in the odd parity register provides the correct ordering of the numbers in the bit positions of the alternate word for use as the corrected word with a minimum use of logic gates.

Simultaneously with the generation of even parity sum outputs on line 64, even parity register 66 is enabled to accept the rotated received word on line 56 and the corrected burst on line 58. As with odd parity register 68 described above, the numbers in the corrected burst are inserted into the corresponding bit positions of the rotated received word to produce an alternate word. The alternate word is stored in even register 66 and rotated simultaneously with the numbers in the receive register as each new syndrome is generated by syndrome generator 48.

Parity logic device 50 produces a parity flag and received flag upon the completion of n syndromes. In the POCSAG format, parity logic device 50 produces flag outputs after thirty one syndromes are generated. If parity logic device 50 receives only odd parity sums on line 62 (when the alternate words have only odd parity), then parity logic device 50 will set the parity flag on line 70 to odd. An odd parity flag on line 70, indicating odd parity, will enable a final latch 72. Upon being enabled by the odd parity flag on line 70, final latch 72 loads the output of odd parity register 68 supplied on line 74. Final latch 72 then supplies the alternate word loaded from odd parity register 68 on a line 76 as the processed, or corrected, word.

If parity logic device 50 receives only even parity sums on line 64 (when the alternate words have only even parity), then parity logic device 50 sets the parity flag on line 70 to even. When the parity flag on line 70 is even, indicating even parity, final latch 72 is enabled to accept the output of even parity register 66 on a line 78. Final latch 72 then supplies the alternate word from even parity register 66 as the processed word on line 76.

When parity generator 60 outputs both even and odd parity sums on line 62 and 64 (when the alternate words have both even and odd parity), the parity bit information input on line 44 to parity logic device 50 is used. This situation is equivalent to the generation of alternate words in the first and second storage registers in Tables 3-5 and 3-6, above. For the processed word to be correct, the processed word must have a parity corresponding to that parity bit, or parity information, received by parity logic device 50 on line 44. Therefore, the alternate word having the same parity as the received parity bit, or the alternate word with parity matching the parity information for the received word, is selected as the processed word on line 76. When the parity information on line 44 indicates that the received word has an odd parity, then parity logic device 50 sets the parity flag on line 70 to odd so that the alternate word in the odd parity register 68 is selected as the processed word. When the parity information on line 44 indicates that the received word has an even parity, then parity logic device 50 sets the parity flag on line 70 to even so that the alternate word in the even parity register 66 is selected as the processed word. It is possible in the communication of data, that the parity bit, or parity information, on line 44 can be received in a corrupted form. To minimize the chance of an incorrect alternate word being selected as the result of a corrupted parity bit, the parity bit is used, in the present invention, to select the processed word only when two alternate words are produced.

In some circumstances, received word error bursts exceeding [(n–k)-⌈log₂ n⌉] bit positions do not allow any alternate words to be produced by the apparatus of FIG. 4. In the POCSAG format, burst error exceeding five bit positions, in some circumstances, do not allow the generation of any alternate words. When no alternate words are produced, parity generator 60 produces neither odd nor even sum outputs on line 62 or 64. When parity logic device 50 receives neither odd nor even parity sum outputs (no parity sums) it supplies a received flag (the receive flag is enabled) on a line 80 to final latch 72. When final latch 72 accepts the received flag, the rotated received word on line 56 is loaded into final latch 72 and output as the processed word on line 76. That is, the received word is used as the corrected word without any corrections.

When the received word on line 44 is correct, then all the syndromes generated will be composed of zeros in both the locating bit positions and the summing bit positions. Therefore, the error trapping process will occur with respect to every syndrome. However, since the summing bits are all zeros, the alternate words are the same as the rotated received words. Also, every alternate word will have the same parity, the parity of the received word. The n alternate words may be kept in n separate registers and rotated with the generation of each new syndrome. Upon completing the generation of the n syndromes, any of the n alternate words may be used as the corrected word since all the alternate words are the same. Alternately, a single register may be used to reduce the number of gates required. Each new alternate word can be inserted into the register to replace the old word in the register since the new and old words are identical.

Even when the received word on line 44 is not correct, the method and apparatus of the present invention may generate multiple syndromes with zeros in the location bits to yield the same alternate word. As shown in Table 3-3, syndromes four through six all have zeros in the locating bit positions, S(4:0), of the syndrome. The apparatus of FIG. 4 error traps for each of these three syndromes. All three alternate words have the same parity, and are therefore, stored in the same register. After rotation, all three alternate words are identical. Therefore, it is irrelevant that the alternate word generated by syndrome five replaces, or eliminates, the alternate word generated by syndrome four. Likewise, it is irrelevant that the alternate word generated by syndrome six replaces the alternate word generated by syndrome five. Therefore, a single register may be used for each parity and the last generated alternate word may be stored over any previously generated alternate words. That is, alternate words with even parity are stored in the even parity register, eliminating the previously stored alternate words, and alternate words with odd parity are stored in the odd parity registers, eliminating the previously stored alternate words.

By using only a single, 1st, register to store alternate words having the same parity, it can be said that the 1st register contains the first alternate word regardless of how many alternate words of the same parity were produced by the error trapping process. Alternately, it can be said that a first alternate word is related to a first burst error of up to $[(n-k)/\lceil \log_2 n \rceil]$ bit positions, even if other alternate words of the same parity are created by other error bursts. Further, it can be said that the first alternate word corresponds to a first parity alternate word.

Likewise, it can be said that a single, 2nd, register, which accepts only alternate words of a different parity from those accepted by the first register, contains the second alternate word, regardless of how many alternate words are loaded into it. Alternately, it can be said that a second alternate word is related to a second burst error of up to $[(n-k)/\lceil \log_2 n \rceil]$ bit positions, even if several alternate words of the same parity are created from several burst error corrections. Since, by the method of the present invention, a register is provided for alternate words of each parity type, and two parities exist, it can be said that the first and second alternate words have opposite parity. Likewise, even and odd parity alternate words correspond to first and second parity alternate words.

Figure 5B:
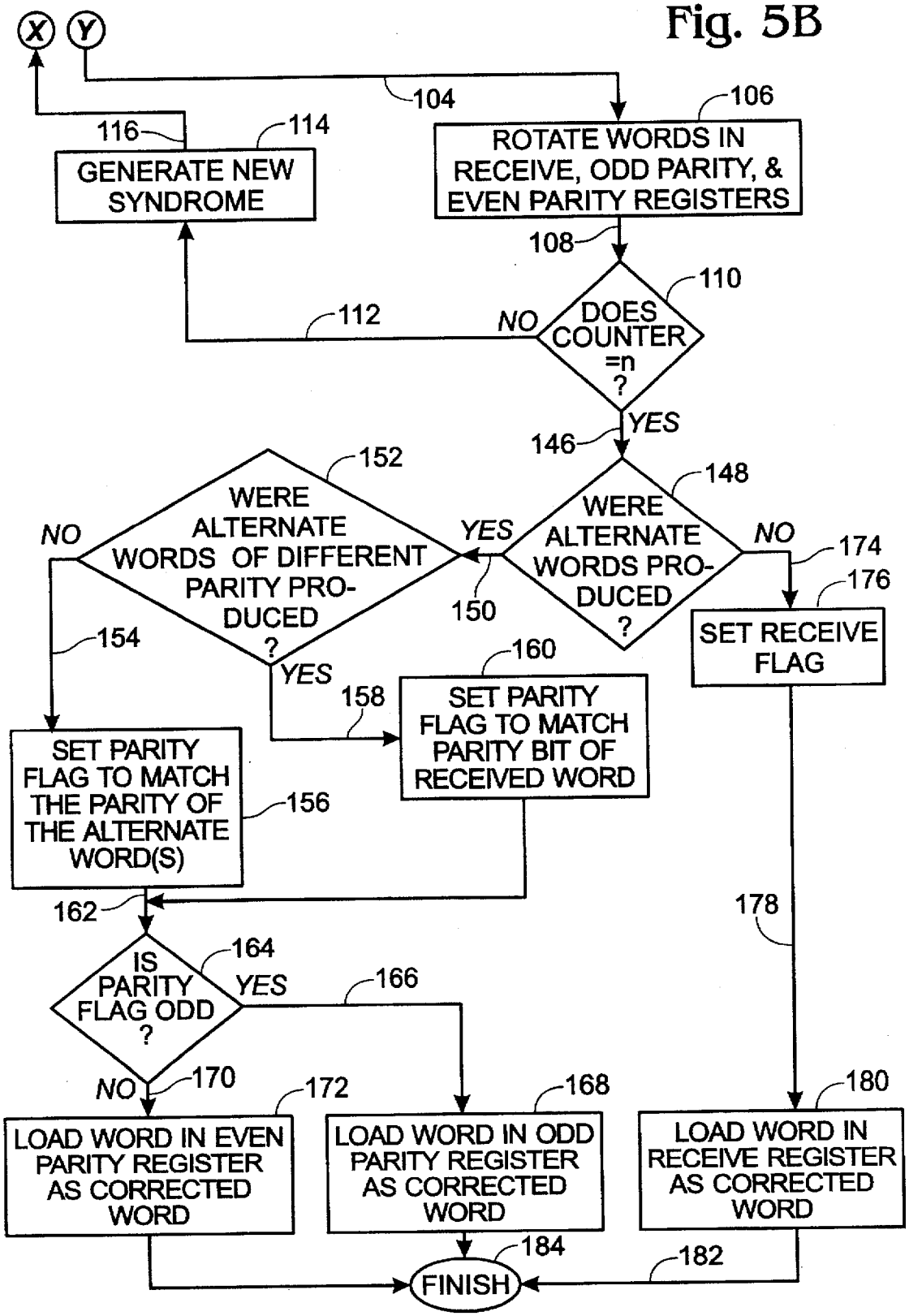
FIG. 5 is a detailed flow diagram of the system and method of burst error correction of FIG. 3.

FIG. 5 illustrates a detailed flow diagram of the system and method of burst error correction of FIG. 3. The method of processing received digital information starts at step 82. Step 82 is connected with a line 84 to a step 86 to receive augmented (n+11) words comprising an uncorrected (n,k) cyclic word and a parity bit, or to receive cyclic words with the parity information being supplied from an independent source. A line 88 connects step 86 to step 90 where the cyclic part of the received word is loaded into the receive register. A line 92 joins step 90 to a step 94 where the parity bit of the received word is loaded into a parity logic device. A line 96 joins step 94 to a step 98 where the first syndrome is generated. A line 100 joins step 98 to a step 102 where it is determined whether all the location bits in the syndrome are zero. The $\lceil \log_2 n \rceil$ location bits are used as a pointer to identify the positions in the received cyclic word with potential errors. In the 31-bit cyclic word of the POCSAG format there are 5-locating bits in the ten bit syndrome.

If the predetermined pattern of zero bits is not found in the location bit positions, then line 104 is followed to step 106 where the numbers and the bit positions of the received word in the receive register, and the alternate words in the odd and even parity registers, are rotated. A line 108 joins step 106 to a step 110 where it is determined if a counter is equal to n, the number of cyclic bit positions. That is, have n syndrome words been generated? In the POCSAG format, it is determined whether thirty one syndromes have been generated. If not, line 112 is followed to a step 114 where a new syndrome is generated. A line 116 joins step 114 to a step 118 where the counter is incremented. A line 120 is used to join step 118 to step 102 which, once again, determines if a predetermined pattern of zeros exists in the location bits of the syndrome word.

If the pattern of numbers in the locating bit positions of the syndrome is discovered, then line 122 is used to join step 102 to a step 124 where the $[(n-k)/\lceil \log_2 n \rceil]$ number of summing bits are added, in modulo 2, to the error bit positions of the uncorrected word corresponding to the bit positions of the locating bits to generate a corrected burst of $[(n-k)/\lceil \log_2 n \rceil]$ bit positions. In the POCSAG format, S(9:5) is added, in modulo 2, to RW(9:5) to produce CB(9:5). A line 126 joins step 124 to a step 128 where the corrected burst, generated in step 124, is inserted into predetermined bit positions of the received word to produce an alternate word. In the POCSAG format, CB(9:5) is inserted into RW(9:5) to produce an alternate word. A line 130 joins step 128 to a step 132 where the parity of the alternate word is checked. That is, the numbers in the bit positions of the first and second (even and odd) alternate words are summed to derive the parity of each word. The result, called the parity sum output, is loaded into a parity logic device. Alternately, it can be said that step 132 checks a parity output indicating the parity of each alternate word, which parity output is used in matching the parity of each alternate word to the parity register having the corresponding parity (see step 136.)

A line 134 joins step 132 to a step 136 where it is determined whether the parity calculated in step 132 is odd. If the parity is odd, then a line 138 is followed to a step 140 where the corrected burst and received word are loaded into an odd parity register so that the corrected burst replaces numbers in predetermined bit positions of the received word to produce an alternate word. In the POCSAG format, CB(9:5) is inserted into bit positions 5 through 9 of the received word, RW(9:5), to produce the odd parity alternate word.

If, in step 136, it is determined that the parity is not odd, then a line 142 is followed to a step 144 where the corrected burst and received word are loaded into an even parity register to produce an alternate word, in a manner similar to the process explained in step 140 above. Alternately, it can be said about steps 140 and 144, that first and second alternate words are produced (in the parity registers) by inserting the corrected burst into (potential) error bit positions of the received, or uncorrected, word.

Line 104 joins steps 144 and 140 to step 106 where the words in the receive register, odd parity register, and even parity register are rotated. When the counter in step 110 equals n, then a line 146 is followed to a step 148 where it is determined whether alternate words were produced. Alternately, it can be determined whether parity sum outputs were generated, since no parity sums outputs are produced unless alternate words are produced.

If it is determined in step 148 that alternate words were produced, then a line 150 is followed to a step 152 where it is determined whether alternate words of different parities were produced. If no alternate words of different parity were produced, then only alternate words of the same parity were produced. In the event that all the alternate words have the same parity, a line 154 is followed to a step 156 in which a parity flag is set to match the parity of the alternate words produced. That is, if only even parity words are produced then the even parity flag is set. Likewise, if only odd parity alternate words are produced, then the odd parity flag is set.

If, in step 152, it is determined that alternate words of different parties were produced, a line 158 is followed to a step 160 where a parity flag is set to match the parity information for the received word. In the POCSAG format, the 32nd-bit is the parity bit. This parity bit is used set the parity flag in step 180. A line 162 joins step 156 and step 160 to a step 164 where it is determined whether the parity flag, set in either step 156 or 160, is odd. If the parity is odd, then a line 166 is followed to a step 168 where the word in the odd parity register is loaded as the corrected or the processed word. If it is determined in step 164 that the parity is even, then a line 170 is followed to a step 172 where the word in the even parity register is loaded as the processed word.

If, in step 148, it is determined that no alternate words were produced, then a line 174 is followed to a step 176 where the received flag is set. A line 178 joins step 176 to a step 180 where the word in the receive register is loaded as the processed word in response to the receive flag. A line 182 joins steps 172, 168, and 180 to the finish process step 184.

The system and method of the present invention provides an improved technique for correcting burst errors in cyclic words. The invention uses independently obtained parity information, or an additional parity bit, to always correct a cyclic word, including those found in BCH codebooks or systems, having n total bits, k information bits, and burst errors up to $[(n-k)-\lceil \log_2 n \rceil]$ bit positions. The prior art method of burst error correction does not always correct burst errors of $[(n-k)-\lceil \log_2 n \rceil]$ bit positions. The parity information is used to differentiate between two alternate words generated as possible corrections to a received word. The POCSAG format especially benefits from the implementation of this invention. In typical POCSAG receiver systems the 32nd-bit, or parity bit, is not used. The method of the present invention uses this parity bit as an additional error checking bit. The present invention allows a POCSAG pager receiver to always correct 5-burst errors, as opposed to only 4-burst errors with the prior art method. By increasing the possibility that a received message will be correctly decoded in a receiver, the present method improves the likelihood that the user will receive the intended message.

To minimize dependence on a possibly corrupt parity bit, the present invention selects the processed word, without reference to the parity information of the received word, when an alternate word, or words, of only one parity are produced. Only when alternate words of different parity are produced, is the parity bit checked to select the processed word.

The present invention is useful, outside of the POCSAG format, in situations where parity information can be obtained from sources independent of the received word. For example, in situations where the received word is received via an airlink on a first channel, the parity information can be received on a second channel. Alternately, digital information systems can be designed to use only words of one parity, even parity for example, so that the parity information is known to be even.

Alternate embodiments of the above described system and method for correcting burst errors in digital information can be applied to any system of digital communication. The method is especially applicable to systems where reliable communication is a necessity. The method of the present invention is also useful as a basis for creating software based systems using a computer program and microprocessor to correct burst errors of up to $[(n-k)-\lceil \log_2 n \rceil]$ bit positions in a (n,k) cyclic word. Other modifications and variations within the scope of the present invention will occur to those skilled in the art.

What is claimed is:

1. In a method of processing uncorrected digital information which includes one or more (n,k) cyclic words, wherein n is the number of bit positions in the word, and k is the number of information bit positions in the word, and further includes parity information about each cyclic word, and wherein the method of correcting uses error trapping, a generating polynomial, and syndromes to identify and replace errors in the uncorrected words to yield corrected words, a method for correcting burst errors of up to $[(n-k)-\lceil \log_2 n \rceil]$ bit positions comprising the steps of:

a) searching by error trapping for the bit positions of a first burst error of up to $[(n-k)-\lceil \log_2 n \rceil]$ bit positions in each uncorrected word and producing a first alternate word therefrom;

b) searching by error trapping for the bit positions of a second burst error of up to $[(n-k)-\lceil \log_2 n \rceil]$ bit positions in each uncorrected word and, if such a second burst error is found, producing a second alternate word therefrom; and c) selecting the first alternate word as the corrected word when no second burst error is found in step b) and, if a second burst error is found in step b), selecting as the corrected word, whichever of the first and second alternate words has a parity corresponding to the parity information of the uncorrected word.

2. A method for correcting burst errors as in claim 1 including providing even parity and odd parity storage registers for receiving the alternate words produced in steps a) and b), and including the following steps:

d) storing the first alternate word as follows:
      i) in the even parity register if the first alternate word has an even parity; and
      ii) in the odd parity register if the first alternate word has an odd parity; and e) storing the second alternate word as follows:
      i) in the even parity register if the second alternate word has an even parity; and
      ii) in the odd parity register if the second alternate word has an odd parity.

3. A method for correcting burst errors as in claim 2, wherein the first and second alternate words have opposite parity, and syndrome words derived in steps a) and b) have (n-k) bit positions of which $[(n-k)-\lceil \log_2 n \rceil]$ bit positions are summing bits and the other $\lceil \log_2 n \rceil$ bit positions are locating bits, and wherein the location of error bit positions in the uncorrected word is indicated by a predetermined pattern of numbers in the locating bit positions, and wherein the numbers in the summing bits are added, in modulo 2, to the numbers in the error bit positions indicated by the locating bit positions yielding a corrected burst of numbers having $[(n-k)-\lceil \log_2 n \rceil]$ bit positions, and including the following steps:

supplying the corrected burst of numbers and the uncorrected word as inputs to the even and odd parity registers; and producing first and second alternate words by inserting the corrected burst of numbers into the error bit positions of the uncorrected words.

4. A method for correcting burst errors as in claim 3 including providing a receive register for receiving uncorrected words, wherein steps a) and b) include rotating the numbers in the bit positions of uncorrected words in the receive register, and further including the step of rotating the numbers in the bit positions of the even and odd parity registers simultaneously with the rotation of the numbers in the receive register.

5. A method for correcting burst errors as in claim 2 including, prior to steps d) and e):

summing the numbers in the bit positions of the first and second alternate words to derive the parity of each alternate word; and supplying a parity output indicating the parity of each alternate word, which parity output is used in matching the parity of each alternate word to the parity register having the corresponding parity.

6. A method for correcting burst errors as in claim 5, wherein an additional bit position is amended to uncorrected (n,k) cyclic words to represent the parity of the cyclic word, the resulting (n+1) augmented words communicating parity information useful in correcting the corresponding uncorrected cyclic word, and wherein the uncorrected words include burst errors of $[(n-k)-\lceil \log_2 n \rceil]$ bit positions so that alternate words are produced, and burst errors of greater than $[(n-k)-\lceil \log_2 n \rceil]$ bit positions so that no alternate words are produced, and including the steps of:

providing an odd parity flag when only a first alternate word is produced, and that first alternate word has an odd parity;

providing an even parity flag when only a first alternate word is produced, and that first alternate word has an even parity;

providing a parity flag matching the parity bit of the uncorrected word when both a first and second alternate word are produced; and providing a receive flag when no alternate words are produced.

7. A method for correcting a burst error as in claim 6 in which alternate words and uncorrected words are selected for the corrected word as follows:

selecting the alternate word in the odd parity register to provide the corrected word when the odd parity flag is supplied;

selecting the alternate word in the even parity register to provide the corrected word when the even parity flag is supplied; and selecting the uncorrected word to provide the corrected word when the receive flag is supplied.

8. In a method of processing received digital information which includes one or more received (n,k) cyclic words, wherein n is the number of bit positions in the word, and k is the number of information bit positions in the word, and further includes parity information for each received word, and wherein the method of processing uses error trapping, a generating polynomial, and syndromes to identify and replace errors in the received words to yield processed words, a method for processing bursts of up to $[(n-k)-\lceil \log_2 n \rceil]$ bit positions comprising the steps of:

a) searching by error trapping for the bit positions of a burst error of up to $[(n-k)-\lceil \log_2 n \rceil]$ bit positions in the received word, producing an alternate word therefrom, and measuring the parity of the alternate word;

b) repeating the error trapping procedure for all n possible bit positions of the received word, producing up to n alternate words therefrom, and making up to n parity measurements of the alternate words; and c) selecting a processed word from among the alternate words as follows:

i) when only one type of parity is measured in the production of the alternate words, selecting any alternate word as the processed word; and ii) when both types of parity are measured in the production of the alternate words, selecting any alternate word with parity matching the parity information for the received word, as the processed word.

9. A method for processing bursts as in claim 8 including providing even parity and odd parity storage registers for storing the alternate words produced in steps a) and b), and including the following steps:

d) storing the alternate words with even parity in even parity registers; and e) storing the alternate words with odd parity in odd parity registers.

10. A method for processing bursts as in claim 9, wherein only one even parity register, and only one odd parity register, are used to store alternate words, and including the steps of:

inserting alternate words with even parity which are produced in steps a) and b) into the even parity register, eliminating the previously stored alternate words; and inserting alternate words with odd parity which are produced in steps a) and b) into the odd parity register, eliminating the previously stored alternate words.

11. A method for processing bursts as in claim 9, wherein the syndrome words derived in steps a) and b) have (n−k) bit positions of which $[(n-k)-\lceil \log_2 n \rceil]$ bit positions are summing bits and the other $\lceil \log_2 n \rceil$ bit positions are locating bits, and wherein the location of potential error bit positions in the received word is indicated by a predetermined pattern of numbers in the locating bit positions, and wherein the numbers in the summing bits are added, in modulo 2, to the numbers in the potential error bit positions indicated by the locating bit positions yielding a corrected burst of numbers having $[(n-k)-\lceil \log_2 n \rceil]$ bit positions, and including the following steps:

supplying the corrected burst of numbers and the received word as inputs to the even and odd parity registers; and producing alternate words by inserting the corrected burst of numbers into the potential error bit positions of the received words.

12. A method for processing bursts as in claim 11 including providing a receive register for accepting received words, wherein steps a) and b) include rotating the numbers in the bit positions of received words in the receive register, and further including the step of rotating the numbers in the bit positions of the even and odd parity registers simultaneously with the rotation of the numbers in the receive register.

13. A method for processing bursts as in claim 12 including the steps of:

providing an odd parity flag when the alternate words have only an odd parity;

providing an even parity flag when the alternate words have only an even parity;

providing a parity flag matching the parity information for the received word when the alternate words have both even and odd parity; and providing a receive flag when no alternate words are produced.

14. A method for processing bursts as in claim 13, wherein an additional bit position is amended to the (n,k) cyclic word to represent the parity of the receive word, wherein the resulting (n+1) augmented words communicate the parity of each received word, and including the steps of selecting the processed word from inputs which include the alternate words and the received words as follows:

selecting the alternate word in the odd parity register to provide the processed word when the parity flag indicates odd parity;

selecting the alternate word in the even parity register to provide the processed word when the parity flag indicates even parity; and selecting the received word to provide the processed word when the receive flag is enabled, whereby the received word is used as the processed word when no alternate words are produced.

15. In a method for processing received POCSAG words of 32 bit positions, wherein 31-bit positions are used for cyclic words and 1-bit position is used for parity information about each cyclic word, and wherein the method for processing uses error trapping, a generating polynomial, and syndromes to identify and replace the numbers in the bit positions of error bits in the received cyclic words to yield processed cyclic words, a method for processing bursts of up to 5-bit positions comprising the steps of:

a) searching by error trapping for the bit positions of bursts of up 5-bit positions in each received word to produce a first parity alternative word;

b) searching by error trapping for the bit positions of bursts of up 5-bit positions in each received word to produce a second parity alternative word having a parity different from the parity of the first alternate word; and c) selecting an alternate word as the processed word as follows:

i) when alternate words are produced in step a), but not step b), selecting the last produced alternate word; and ii) when alternate words are produced in steps a) and b), selecting the last produced alternate word having the parity of the received POCSAG word parity bit.

16. A method for processing bursts in a POCSAG word as in claim 15, wherein the first and second parities include even and odd parities, and including providing even and odd parity storage registers for the alternate words produced in steps a) and b), and including the following steps:

d) storing the even parity alternate words in the even parity register;

e) storing the odd parity alternate words produced in the odd parity register.

17. A method for processing bursts in a POCSAG word as in claim 16 including providing a receive register for accepting the received words, wherein steps a) and b) include rotating the numbers in the bit positions of received words in the receive register, and further including the step of rotating the numbers in the bit positions of the even and odd parity registers simultaneous to the rotation of the numbers in the receive register.

18. A method for processing bursts in a POCSAG word as in claim 17 including the following steps:

summing numbers in predetermined bit positions of the syndromes, in modulo 2, to numbers in predetermined bit positions of the received words to produce corrected bursts of 5-bit positions; and producing alternate words, in the even and odd parity registers, by inserting the numbers of the corrected bursts into predetermined bit positions of the received words.

19. A method for processing bursts in a POCSAG word as in claim 18, including the steps of:

summing the numbers in the bit positions of the alternate words to calculate the parity of the alternate words; and producing an even parity sum output and an odd parity sum output, corresponding to the calculated parities of the alternate words to operatively control the even and odd parity registers so that even parity alternate words are loaded into the even parity register and odd parity alternate words are loaded into the odd parity register.

20. A method for processing bursts in a POCSAG word as in claim 19, wherein a parity flag and a receive flag control the selection of the processed word, and including the step of selecting the processed word from inputs including the alternate words in the even and odd parity register and received words, the inputs selected in response to a parity flag and receive flag as follows:

when the parity flag indicates odd parity, the alternate word in the odd parity register is selected to provide the processed word;

when the parity flag indicates even parity, the alternate word in the even parity register is selected to provide the processed word; and when the receive flag is enabled, the received word is selected to provide the processed word, whereby the received word is used as the processed word when no corrections have been made to the received word.

21. A method for processing bursts in a POCSAG word as in claim 20, wherein the parity flag and receive flag are produced from inputs including the even and odd parity sum outputs and the parity bit of the received POCSAG word, and including the steps of:

selecting the odd parity flag when only odd parity sum outputs are detected;

selecting the even parity flag when only even parity sum outputs are detected;

selecting the parity flag matching the parity bit of the received POCSAG word when both odd and even parity sum outputs are detected; and selecting the receive flag when no parity sum outputs are detected.

22. In a method of processing received digital information which includes one or more received (n,k) cyclic words, wherein n is the number of bit positions in the word, and k is the number of information bit positions in the word, and further includes parity information for each received word, and wherein the method of processing uses error trapping, a generating polynomial, and syndromes to identify and replace errors in the received words to yield processed words, an apparatus for processing bursts of up to $[(n-k)-\lceil \log_2 n \rceil]$ bit positions comprising:

at least one register to store alternate words produced by error trapping for errors in up to $[(n-k)-\lceil \log_2 n \rceil]$ bit positions in the received word;

a parity generator to accept the numbers in the n bit positions of the alternate words to calculate the parity of the alternate words, and to produce a parity sum output to indicate the calculated parity; and a final latch to select the processed word in response to the parity of the alternate and received words as follows:

when the alternate words have only odd parity, an alternate word having odd parity is selected as the processed word;

when the alternate words have only even parity, an alternate word having even parity is selected as the processed word; and when the alternate words have both even and odd parity, the alternate word with parity matching the parity information for the received word is selected as the processed word.

23. The apparatus for processing bursts as in claim 22 in which said register comprises an even parity register and an odd parity register, and in which said even and odd parity registers are operatively controlled by said parity generator so that alternate words with odd parity are received into said odd parity register, and alternate words with even parity are received into said even parity register.

24. The apparatus for processing bursts as in claim 23 further comprising a receive register to accept the received words, wherein the production of alternate words includes rotation of numbers in the bit positions of the received words in said receive register, and in which the numbers in said odd and even parity registers rotate simultaneously with the rotation of numbers in said receive register.

25. The apparatus for processing bursts as in claim 24 further comprising a summing circuit which accepts numbers from predetermined bit positions of syndrome words, and numbers from predetermined bit positions the received words, said summing circuit adding the syndrome numbers, in modulo 2, with the numbers from the received words to provide corrected numbers in a burst of $[(n-k)-\lceil \log_2 n \rceil]$ bit positions, said summing circuit providing an output to supply said even and odd parity registers and said parity generator, and in which said even and odd parity registers accept corrected bursts from said summing circuit and received words from said receive register, the numbers in the corrected bursts being inserted into predetermined bit positions of the received words to produce alternate words in said even and odd parity registers, and in which said parity generator accepts corrected bursts provided by said summing circuit, and received words from said receive register, the numbers in the corrected bursts being inserted into predetermined bit positions of the received words to produce alternate words, which are summed in said parity generator to determine the parity of the alternate words.

26. The apparatus for processing bursts as in claim 25 in which said final latch accepts words, selected from either said parity or received word registers, in response to a parity flag and receive flag as follows:

when the parity flag indicates odd parity, the alternate word in said odd parity register is accepted;

when the parity flag indicates even parity, the alternate word in said even parity register is accepted; and when the receive flag is enabled, the received word in said receive register is accepted.

27. The apparatus for processing bursts as in claim 26, wherein the (n,k) cyclic words are amended to include an additional bit representing the parity information of the received word, and further comprising a parity logic device operatively connected to accept the parity bit of the received word and the parity sum output of said parity generator to set the parity and receive flags as follows:

when said parity generator outputs only odd parity sums, said parity logic device sets the parity flag to odd;

when said parity generator outputs only even parity sums, said parity logic device sets the parity flag to even;

when said parity generator outputs both even and odd parity sums, said parity logic device sets the parity flag to match the parity bit of the received word; and when said parity generator outputs no parity sums, the receive flag is enabled.

28. The apparatus for processing bursts as in claim 27, wherein the received word is formatted in accordance with the POCSAG standard so that (n=31), (k=21), and the apparatus is able to correct a burst error of up to $[(n-k)-\lceil \log_2 n \rceil]=5$ bit positions.

* * * * *